US008941695B2

(12) United States Patent
Yamashita et al.

(10) Patent No.: US 8,941,695 B2
(45) Date of Patent: Jan. 27, 2015

(54) DISPLAY DEVICE, DRIVING METHOD OF DISPLAY DEVICE, AND ELECTRONIC APPARATUS

(75) Inventors: Junichi Yamashita, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 843 days.

(21) Appl. No.: 12/923,447

(22) Filed: Sep. 22, 2010

(65) Prior Publication Data

US 2011/0080437 A1 Apr. 7, 2011

(30) Foreign Application Priority Data

Oct. 2, 2009 (JP) ............................... P2009-230235

(51) Int. Cl.

| | |
|---|---|
| ***G09G 3/32*** | (2006.01) |
| ***G09G 5/10*** | (2006.01) |
| ***H01L 27/15*** | (2006.01) |

(52) U.S. Cl.

CPC ...... *G09G 3/3233* (2013.01); *G09G 2300/0819* (2013.01); *G09G 2300/0842* (2013.01); *G09G 2300/0866* (2013.01); *G09G 2320/029* (2013.01); *G09G 2320/043* (2013.01); *G09G 2320/045* (2013.01); *G09G 2360/145* (2013.01)

USPC ................ 345/690; 345/76; 345/77; 345/82; 345/98

(58) Field of Classification Search

USPC .................. 345/76, 77, 82, 211, 214, 690, 98

See application file for complete search history.

(56) References Cited

U.S. PATENT DOCUMENTS

| | | | | |
|---|---|---|---|---|
| 7,442,956 B2 * | 10/2008 | Yamada | .......................... | 257/59 |
| 2004/0066363 A1 * | 4/2004 | Yamano et al. | ................. | 345/98 |

FOREIGN PATENT DOCUMENTS

| | | |
|---|---|---|
| JP | 2007-156044 | 6/2007 |
| JP | 2007156044 A * | 6/2007 |

* cited by examiner

*Primary Examiner* — Amare Mengistu
*Assistant Examiner* — Jennifer Zubajlo
(74) *Attorney, Agent, or Firm* — Rader, Fishman & Grauer PLLC

(57) ABSTRACT

A display device includes: first dummy pixels including a self-emission element emitting first color light corresponding to emission colors of pixels in a display area; second dummy pixels including a self-emission element emitting the first color light and a self-emission element emitting second color light and causing both self-emission elements to emit light at the same time; a deterioration degree calculating unit calculating a deterioration degree in brightness of the self-emission element emitting the first color light on the basis of a brightness detection result of the first dummy pixels and calculating a deterioration degree in current flowing in the self-emission element emitting the first color light on the basis of brightness detection results of the first and second dummy pixels; and a correction unit correcting the brightness of effective pixels contributing to an image display on the basis of the deterioration degree in brightness and the deterioration degree in current calculated by the deterioration degree calculating unit.

17 Claims, 16 Drawing Sheets

BEFORE t=t11 t=t11 t=t12 t=t13

THRESHOLD CORRECTION: NONE, MOBILITY CORRECTION: NONE

THRESHOLD CORRECTION: MADE, MOBILITY CORRECTION: NONE

THRESHOLD CORRECTION: MADE, MOBILITY CORRECTION: MADE

DISPLAY DEVICE, DRIVING METHOD OF DISPLAY DEVICE, AND ELECTRONIC APPARATUS

BACKGROUND OF THE INVENTION

1. Field of the Invention

The present invention relates to a display device, a driving method of a display device, and an electronic apparatus, and more particularly, to a flat-panel display device in which pixels including electro-optical elements are two-dimensionally arranged in a matrix, a driving method of the display device, and an electronic apparatus including the display device.

2. Description of the Related Art

Recently, in the field of display devices displaying an image, flat-panel self-emission display devices in which pixels (pixel circuits) using a self-emission type element (self-emission element) as an electro-optical element are arranged in a matrix have rapidly spread. For example, as the self-emission element, an organic EL (Electro-Luminescence) element employing a phenomenon of emitting light by applying an electric field to an organic thin film is known. The organic EL element is a so-called current-driven electro-optical element of which the emission brightness varies depending on the value of current flowing in a device.

The organic EL display device using the organic EL element as an electro-optical element has the following features. That is, the organic EL element can be driven with a voltage of 10 V or less and thus has low power consumption. Since the organic EL element is a self-emission element, the visibility of an image is higher than that of a liquid crystal display device displaying an image by controlling light intensity from a light source to a liquid crystal of each pixel. In addition, since an illumination member such as a backlight is not necessary, it can easily decrease in weight and thickness. Since the response speed of the organic EL element is about several μsec which is very great, an afterimage is not caused at the time of displaying a video.

On the other hand, it is known that the organic EL element generally decreases in brightness efficiency in proportion to an emission amount and an emission time. In a display device using such an organic EL element, when an image of a fixed pattern like a time display is repeatedly displayed in a specific display area on a display screen, the organic EL elements in the specific display area have a higher deterioration rate than that of the organic EL elements in the other display area.

Since the brightness of the deteriorated organic EL elements in the specific display area is lower than the brightness of the organic EL elements in the other display area, the portion of the specific display area is visualized as uneven brightness. That is, when an image of a fixed pattern is repeatedly displayed in a specific display area on a display screen, a so-called image burn-in phenomenon in which the display portion of the specific display area is visualized as fixed uneven brightness occurs.

The removal of the image burn-in phenomenon is the most important goal in a self-emission display device represented by an organic EL display device. Accordingly, to correct the image burn-in phenomenon from the viewpoint of signal processing in the past, dummy pixels not contributing to an image display were disposed outside a pixel array section (display area), the brightness deterioration states of the dummy pixels were detected, and the image burn-in was corrected on the basis of the detection result (for example, see JP-A-2007-156044).

SUMMARY OF THE INVENTION

The brightness of the organic EL element is deteriorated due to its emission state. On the contrary, the transistor characteristic of a transistor in a pixel varies due to the application of different color light other than the emission color of the pixel. When the transistor characteristic of a pixel varies, current flowing in the organic EL element varies. The variation in current at this time becomes a current deterioration based on the application of different color light. This current deterioration causes the brightness deterioration of the organic EL element, which serves as a factor causing the image burn-in phenomenon. Therefore, in correcting the image burn-in, it is necessary to make a correction in consideration of the image burn-in due to the current deterioration based on the application of different color light.

Therefore, it is desirable to provide a display device which can correct an image burn-in in consideration of the image burn-in due to the current deterioration based on the application of different color light, a driving method of the display device, and an electronic apparatus including the display device.

According to an embodiment of the invention, there is provided a driving method of a display device including first dummy pixels including a self-emission element emitting first color light corresponding to emission colors of pixels in a display area and second dummy pixels including a self-emission element emitting the first color light and a self-emission element emitting second color light and causing both self-emission elements to emit light at the same time, the driving method including the steps of: calculating a deterioration degree in the brightness of the self-emission element emitting the first color light on the basis of a brightness detection result of the first dummy pixels and calculating a deterioration degree in the current flowing in the self-emission element emitting the first color light on the basis of brightness detection results of the first and second dummy pixels; and correcting the brightness of effective pixels contributing to an image display on the basis of the calculated deterioration degree in the brightness and the calculated deterioration degree in the current.

The deterioration degree in the brightness of the self-emission elements emitting the first color light is obtained from the brightness detection result of the first dummy pixels emitting the first color light. On the other hand, the deterioration degree in the current flowing in the self-emission elements emitting the first color light is obtained from the brightness detection result of the second dummy pixels emitting the first color light and the second color light at the same time. By correcting the brightness of the effective pixels contributing to an image display on the basis of the obtained deterioration degree in the brightness and the obtained deterioration degree in the current, it is possible to realize the correction of the image burn-in inconsideration of the image burn-in due to the current deterioration based on the application of the second color light other than the first color light in addition to the image burn-in due to the brightness deterioration of the self-emission elements emitting the first color light.

According to the above-mentioned configuration, since it is possible to correct the image burn-in in consideration of the image burn-in due to the current deterioration based on the application of the second color light other than the first color light, it is possible to more accurately correct the image burn-in, compared with the case where only the image burn-in due to the brightness deterioration is corrected.

BRIEF DESCRIPTION OF THE DRAWINGS

FIG. 18A is a perspective view as viewed from the front side and FIG. 18B is a perspective view as viewed from the back side.

FIG. 21A is a front view illustrating an opened state, FIG. 21B is a side view, FIG. 21C is a front view illustrating a closed state, FIG. 21D is a left side view, FIG. 21E is a right side view, FIG. 21F is a top view, and FIG. 21G is a bottom view.

DESCRIPTION OF THE PREFERRED EMBODIMENTS

Hereinafter, modes for implemeing the invention (hereinafter, referred to as "embodiments") will be described in detail with reference to the accompanying drawings. The explanation will be given in the following order.

1. Display Device (Organic EL Display Device) according to Embodiment of the Invention 1-1. System Configuration 1-2. Circuit Operation 2. Image Burn-in Phenomenon 2-1. Image Burn-in Phenomenon due to Brightness Deterioration of Organic EL Element 2-2. Image Burn-in Phenomenon due to Current Deterioration 2-3. Brightness Deterioration due to Influence of Blue Light 3. Embodiments 3-1. Image Burn-in Correcting Circuit 3-2. Operations and Advantages of Embodiments 4. Modified Examples 5. Applications (Electronic Apparatuses)

1. DISPLAY DEVICE ACCORDING TO EMBODIMENT OF THE INVENTION

1-1. System Configuration

Figure 1:
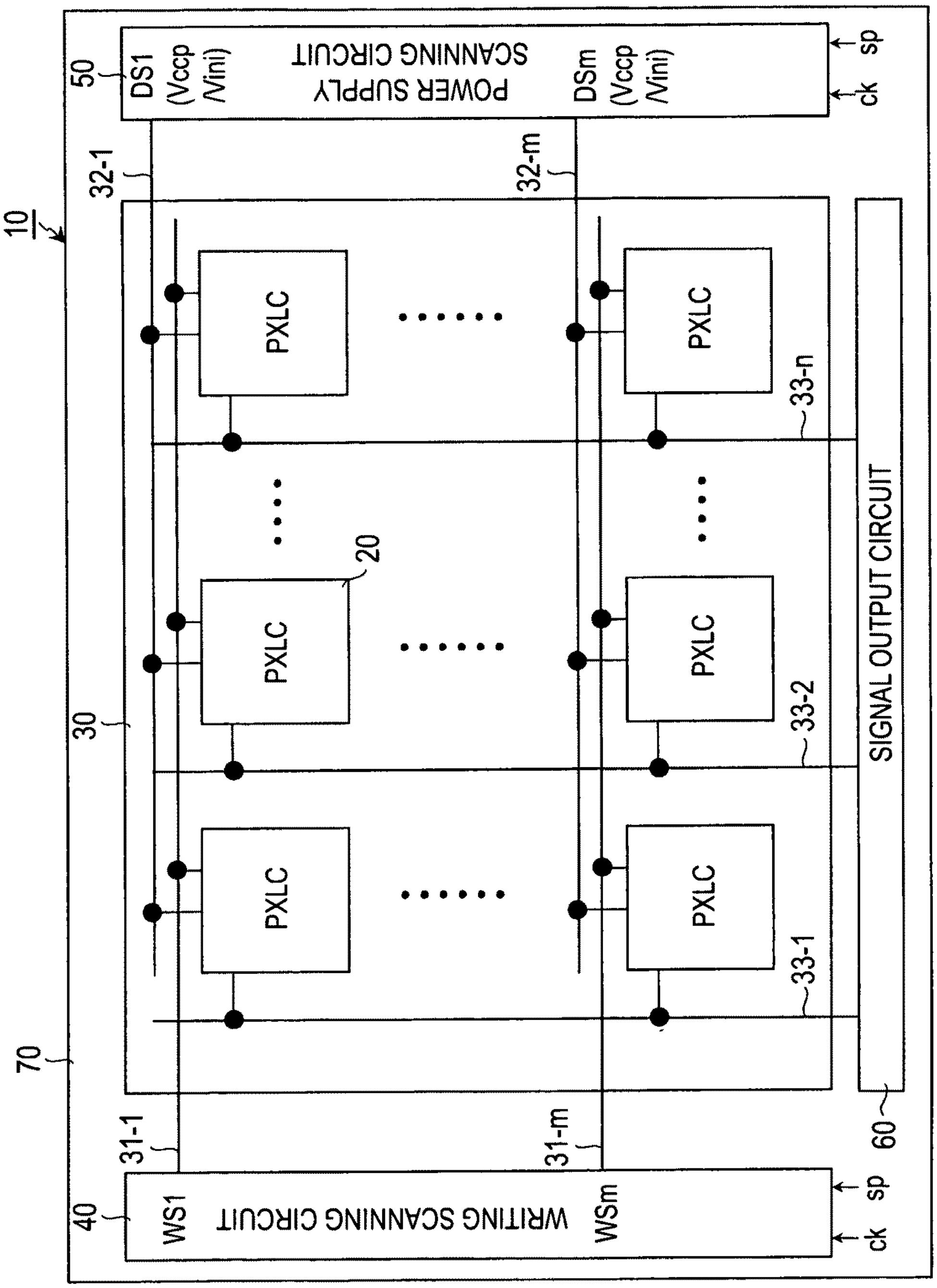
FIG. 1 is a system configuration diagram schematically illustrating the configuration of an organic EL display device according to an embodiment of the invention.

FIG. 1 is a system configuration diagram schematically illustrating the configuration of an active matrix type display device according to an embodiment of the invention. Here, an active matrix type organic EL display device employing current-driven electro-optical elements varying in emission brightness depending on current flowing in the device, such as organic EL elements, as light-emitting elements of pixels (pixel circuits) will be described as an example.

As shown in FIG. 1, an organic EL display device 10 according to this application includes a pixel array unit 30 in which plural pixels 20 including organic EL elements are two-dimensionally arranged in a matrix and a driving unit disposed around the pixel array unit 30. The driving unit includes a writing scanning circuit 40, a power supply scanning circuit 50 as a power supply unit, and a signal output circuit 60 and drives the pixels 20 of the pixel array unit 30.

Here, when the organic EL display device 10 copes with a color display, each pixel includes plural sub pixels and this sub pixel corresponds to the pixel 20. More specifically, in a color display device, each pixel includes three sub pixels of a sub pixel emitting red light (R), a sub pixel emitting green light (G), and a sub pixel emitting blue light (B).

However, each pixel is not limited to the combination of sub pixels of three primary colors of R, G, and B, but one or more color sub pixels may be added to the sub pixels of three primary colors to form one pixel. More specifically, at least one sub pixel emitting white light (W) to improve the brightness may be added to form one pixel or at least one sub pixel emitting complementary color light to enlarge a color reproducing range may be added to form one pixel.

In the pixel array unit 30, scanning lines 31-1 to 31-*m* and power supply lines 32-1 to 32-*m* are arranged in the row direction (a pixel arrangement direction in each pixel row) by pixel rows in the arrangement the pixels 20 of m rows and n columns. Signal lines 33-1 to 33-*n* are arranged in the column direction (a pixel arrangement direction of each pixel column) by pixel columns.

The scanning lines 31-1 to **31-*m* are connected to the output terminals of the corresponding rows of the writing scanning circuit 40, respectively. The power supply lines 32-1 to 32-*m* are connected to the output terminals of the corresponding rows of the power supply scanning circuit 50, respectively. The signal lines 33-1 to 33-*n* are connected to the output terminals of the corresponding columns of the signal output circuit 60**, respectively.

The pixel array unit 30 is formed on a transparent insulating substrate such as a glass substrate. Accordingly, the organic EL display device 10 has a flat-panel type panel structure. The driving circuits of the pixels 20 of the pixel array unit 30 can be formed using amorphous silicon TFT or low-temperature polysilicon TFT. When the low-temperature polysilicon TFT is used, the writing scanning circuit 40, the power supply scanning circuit 50, and the signal output circuit 60 can be mounted on the display panel (substrate) 70 forming the pixel array unit 30, as shown in FIG. 1.

The writing scanning circuit 40 includes shift registers sequentially shifting (transmitting) a start pulse sp in synchronization with a clock pulse ck. The writing scanning circuit 40 sequentially scans (line-sequentially scans) the pixels 20 of the pixel array unit 30 in the unit of rows by sequentially supplying a writing scanning signal WS (WS1 to WSm) to the scanning lines 31-1 to **31-*m* at the time of writing image signals to the pixels 20 of the pixel array unit 30**.

The power supply scanning circuit 50 includes shift registers sequentially shifting a start pulse sp in synchronization with the clock pulse ck. The power supply scanning circuit 50 supplies source potentials DS (DS1 to DSm), which are switched between a first source potential Vccp and a second source potential Vini lower than the first source potential Vccp, to the power supply lines 32-1 to **32-*m* in synchronization with the line sequential scanning by the writing scanning circuit 40. As described later, the emission/non-emission of the pixels 20** are controlled by the switching of the source potential DS between Vccp and Vini.

The signal output circuit 60 has a selector structure selectively outputting a signal voltage (hereinafter, may be referred to as "signal voltage") Vsig of an image signal supplied from a signal source (not shown) and corresponding to the brightness information and a reference potential Vofs. Here, the reference potential Vofs is a potential (for example, a potential corresponding to a black level of an image signal) serving as a reference of the signal voltage Vsig of, an image signal.

The signal voltage Vsig and the reference potential Vofs output from the signal output circuit 60 are written to the pixels 20 of the pixel array unit 30 via the signal lines 33-1 to **33-*n* in the unit of rows. That is, the signal output circuit 60** employs a line-sequential writing type of writing the signal voltage Vsig in the unit of rows (lines).

(Pixel Circuit)

Figure 2:
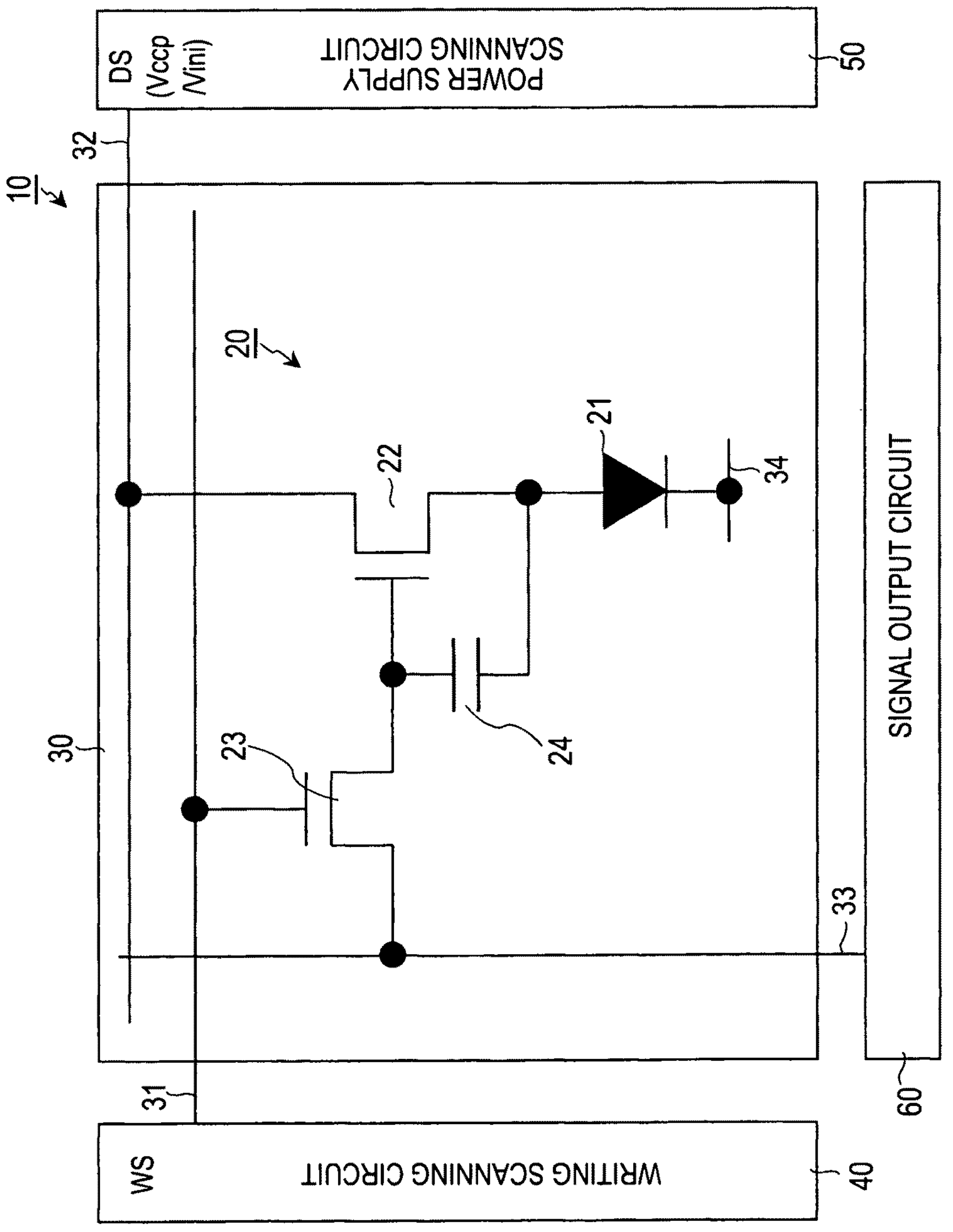
FIG. 2 is a circuit diagram illustrating the circuit configuration of a pixel (pixel circuit) of the organic EL display device according to the embodiment of the invention.

FIG. 2 is a circuit diagram illustrating the specific circuit configuration of each pixel (pixel circuit) 20.

As shown in FIG. 2, each pixel 20 includes an organic EL element 21 as a current-driven electro-optical element of which the emission brightness varies depending on the value of current flowing in the device and a driving circuit driving the organic EL element 21. The cathode electrode of the organic EL element 21 is connected to the common power supply line 34 connected in common (so-called solid-connected) to all the pixels 20.

The driving circuit driving the organic EL element 21 includes a driving transistor 22, a writing transistor 23, and a retention capacitor 24. Here, an N-channel transistor such as a thin film transistor (TFT) is used as the driving transistor 22 and the writing transistor 23. However, the conductive type combination of the driving transistor 22 and the writing transistor 23 is only an example, and the invention is not limited to this combination.

When an N-channel TFT is used as the driving transistor 22 and the writing transistor 23, an amorphous silicon (a-Si) process can be used. By using the a-Si process, it is possible to reduce the cost of the substrate in which the TFT is formed and thus to reduce the cost of the organic EL display device 10. When the driving transistor 22 and the writing transistor 23 have the same conductive type, both transistors 22 and 23 can be formed by the same process, there reducing the cost.

One electrode (source/drain electrode) of the driving transistor 22 is connected to the anode electrode of the organic EL element 21 and the other electrode (drain/source electrode) is connected to the power supply line 32 (32-1 to **32-*m***).

One electrode (source/drain electrode) of the writing transistor 23 is connected to the signal line 33 (33-1 to **33-*n*) and the other electrode (drain/source electrode) is connected to the gate electrode of the driving transistor 22. The gate electrode of the writing transistor 23 is connected to the scanning line 31 (31-1 to 31-*m***).

In the driving transistor 22 and the writing transistor 23, one electrode means a metal line electrically connected to the source/drain region and the other electrode means a metal line electrically connected to the drain/source region. On the basis of the potential relation of one electrode and the other electrode, when one electrode serves as a source electrode, the electrode also serves as a drain electrode. When the other electrode serves as a drain electrode, the electrode also serves as a source electrode.

One electrode of the retention capacitor 24 is connected to the gate electrode of the driving transistor 22 and the other electrode thereof is connected to the other electrode of the driving transistor 22 and the anode electrode of the organic EL element 21.

The driving circuit of the organic EL element 21 is not limited to the circuit configuration including two transistors of the driving transistor 22 and the writing transistor 23 and one capacitive element of the retention capacitor 24.

As another circuit configuration, for example, a circuit configuration in which an auxiliary capacitor of which one electrode is connected to the anode electrode of the organic EL element 21 and the other electrode is connected to a fixed potential to compensate for insufficient capacity of the organic EL element 21 may be employed. A circuit configuration in which a switching transistor is connected in series to the driving transistor 22 and the emission/non-emission of the organic EL element 21 is controlled by the turn-on/turn-off of the switching transistor may be employed.

In the pixel 20 having the above-mentioned configuration, the writing transistor 23 is turned on in response to a high-active writing scanning signal WS supplied to the gate electrode from the writing scanning circuit 40 via the scanning line 31. Accordingly, the writing transistor 23 samples the signal voltage Vsig of the image signal supplied from the signal output circuit 60 via the signal line 33 and corresponding to the brightness information supplied or the reference potential Vofs and writes the sampled potential to the pixel 20. The written signal voltage Vsig or reference potential Vofs is applied to the gate electrode of the driving transistor 22 and is retained in the retention capacitor 24.

When the potential DS of the power supply line 32 (32-1 to **32-*m*) is the first source potential Vccp, one electrode of the driving transistor 22 serves as the drain electrode and the other electrode serves as the source electrode, whereby the driving transistor operates in a saturated region. Accordingly, the driving transistor 22 is supplied with current from the power supply line 32 and drives the organic EL element 21 to emit light by the use of the current. More specifically, since the driving transistor 22 operates in the saturated region, the driving transistor supplies the organic EL element 21 with the driving current with a current value corresponding to the voltage value of the signal voltage Vsig retained in the retention capacitor 24 and current-drives the organic EL element 21** to emit light.

When the source potential DS is changed from the first source potential Vccp to the second source potential Vini, one electrode of the driving transistor 22 serves as the source electrode and the other electrode serves as the drain electrode, whereby the driving transistor serves as a switching transistor. Accordingly, the driving transistor 22 stops the supply of the driving current to the organic EL element 21 and causes the organic EL element 21 not to emit light. That is, the driving transistor 22 also has a function of a transistor controlling the emission/non-emission of the organic EL element 21.

A period (non-emission period) is provided in which the organic EL element 21 is in the non-emission state by the switching operation of the driving transistor 22, whereby the ratio (duty) of the emission period and the non-emission period of the organic EL element 21 can be controlled. Since the afterimage fog due to the emission of light from the pixel over one frame can be reduced by the duty control, it is possible to improve the image quality of a video.

Out of the first and second source potentials Vccp and Vini selectively supplied from the power supply scanning line 50 via the power supply line 32, the first source potential Vccp is a source potential for supplying the driving current used to the organic EL element 21 to emit light to the driving transistor 22. The second source potential Vini is a source potential for applying a reverse bias to the organic EL element 21. The second source potential Vini is set to a potential lower than the reference potential Vofs, for example, a potential lower than Vofs−Vth where Vth represents the threshold voltage of the driving transistor 22, and preferably to a potential much lower than Vofs−Vth.

1-2. Circuit Operation

The basic circuit operation of the organic EL display device 10 having the above-mentioned configuration will be described with reference to the timing waveform diagram of FIG. 3 and the operation diagrams of FIGS. 4A to 4D and FIGS. 5A to 5D. In the operation diagrams of FIGS. 4A to 4D and FIGS. 5A to 5D, the writing transistor 23 is shown as a switch symbol for the purpose of simplification of the drawings. An equivalent capacitor 25 of the organic EL element 21 is also shown.

Figure 3:
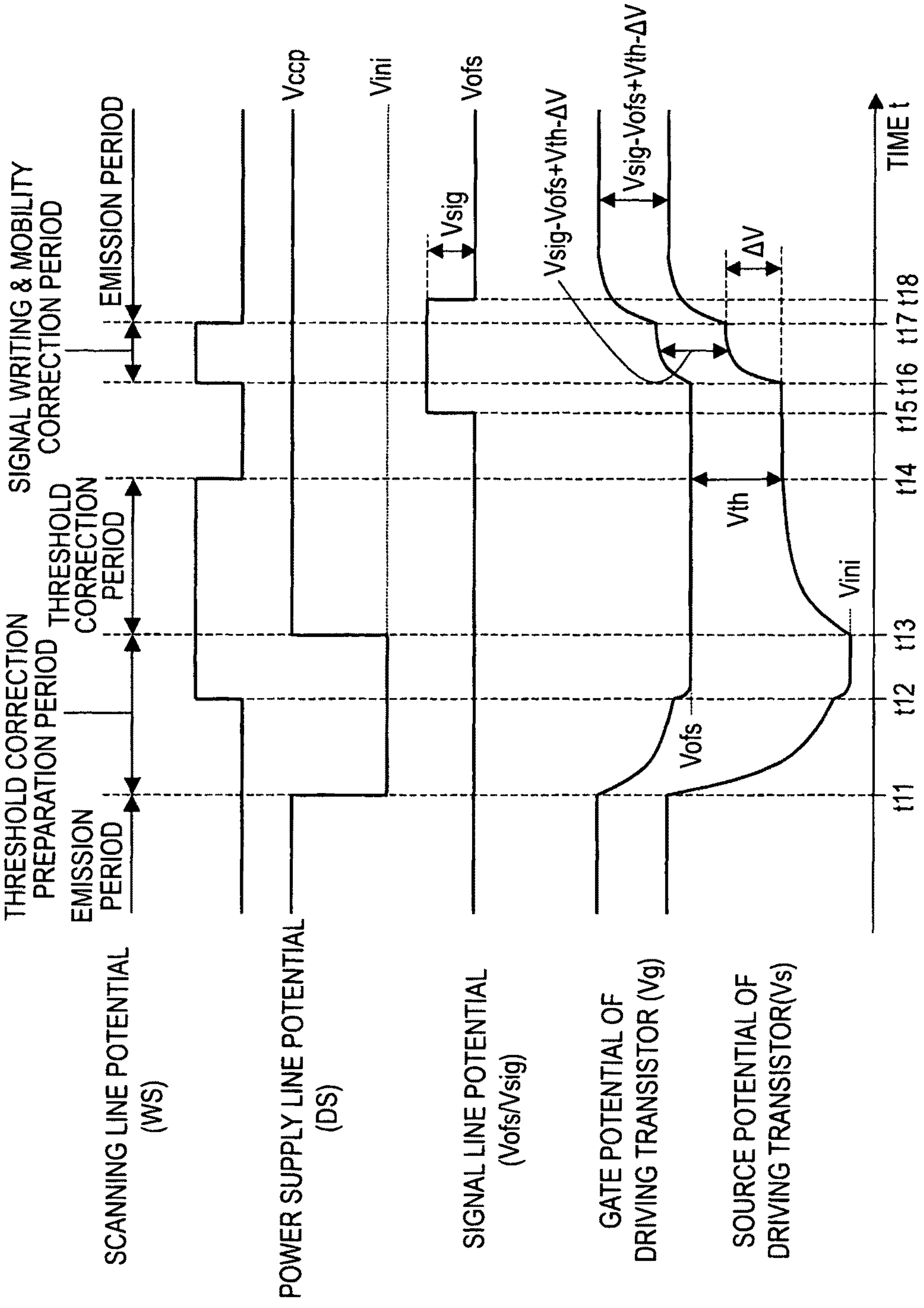
FIG. 3 is a timing waveform diagram illustrating a basic circuit operation of the organic EL display device according to the embodiment of the invention.

In the timing waveform diagram of FIG. 3, the variations of the potential (writing scanning signal) WS of the scanning line 31, the potential (source potential) DS of the power supply line 32, the potential (Vsig/Vofs) of the signal line 33, and the gate potential Vg and the source potential Vs of the driving transistor 22 are shown.

(Emission Period of Previous Frame)

In the timing waveform diagram of FIG. 3, the emission period of the organic EL element 21 in the previous frame (field) is disposed before time t11. In the emission period of the previous frame, the potential DS of the Power supply line 32 is the first source potential (hereinafter, referred to as "high potential") Vccp and the writing transistor 23 is turned off.

Figure 4A:
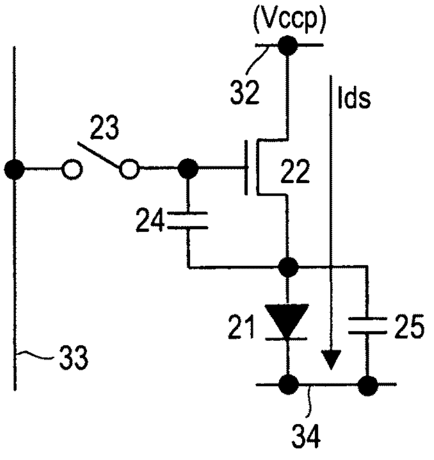
FIGS. 4A to 4D are (first) diagrams illustrating the basic circuit operation of the organic EL display device according to the embodiment of the invention.

At this time, the driving transistor 22 operates in the saturated region. Accordingly, as shown in FIG. 4A, the driving current (drain-source current) Ids corresponding to the gate-source voltage Vgs of the driving transistor 22 is supplied to the organic EL element 21 from the power supply line 32 via the driving transistor 22. Therefore, the organic EL element 21 emits light with the brightness corresponding to the current value of the driving current Ids.

(Threshold Correction Preparation Period)

Figure 4B:
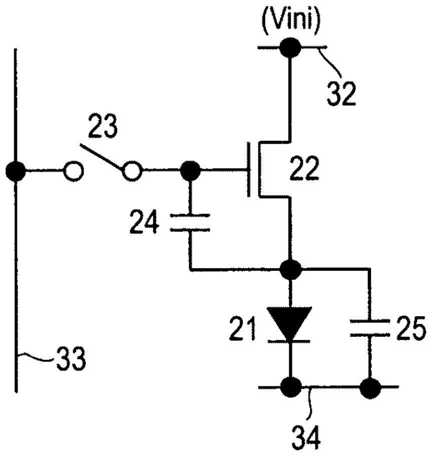

At time t11, a new frame (present frame) in the line-sequential scanning is started. As shown in FIG. 4B, the potential DS of the power supply line 32 is changed from the high potential Vccp to the second source potential (hereinafter, referred to as "low potential") Vini much lower than Vofs−Vth with respect to the reference potential Vofs of the signal line 33.

Here, the threshold voltage of the organic EL element 21 is Vthel and the potential (cathode potential) of the common power supply line 34 is Vcath. At this time, when the low potential Vini is set to be Vini<Vthel+Vcath, the source potential Vs of the driving transistor 22 is roughly equal to the low potential Vini and thus the organic EL element 21 is changed to a reverse bias state, whereby the organic EL element does not emit light.

Figure 4C:
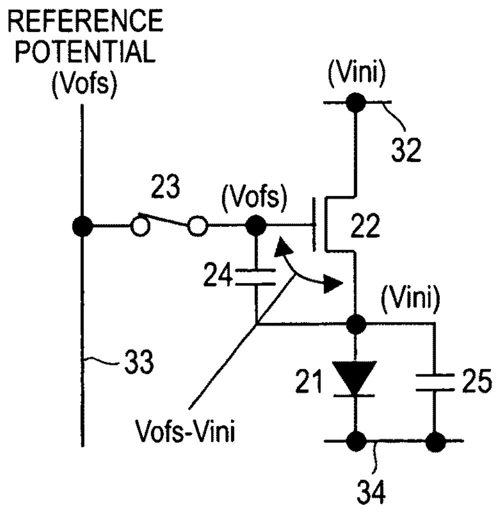

At time t12, the potential WS of the scanning line 31 is changed from a low potential to a high potential, and thus the writing transistor 23 is turned on as shown in FIG. 4C. At this time, since the reference potential Vofs is supplied to the signal line 33 from the signal output circuit 60, the gate potential Vg of the driving transistor 22 becomes the reference potential Vofs. The source potential Vs of the driving transistor 22 is the potential Vini much lower than the reference potential Vofs.

At this time, the gate-source voltage Vgs of the driving transistor 22 becomes Vofs−Vini. Here, when Vofs−Vini is not greater than the threshold voltage Vth of the driving transistor 22, a threshold correcting process to be described later cannot be performed, whereby it is necessary to set the potential relation of Vofs−Vini>Vth.

In this way, the process of fixing (determining) the gate potential Vg of the driving transistor 22 to the reference potential Vofs and fixing the source potential Vs to the low potential Vini to initialize the potentials is a preparation process (threshold correction preparation process) before the threshold correcting process to be described later is performed. Therefore, the reference potential Vofs and the low potential Vini are the initial potentials of the gate potential Vg and the source potential Vs of the driving transistor 22.

(Threshold Correction Period)

Figure 4D:
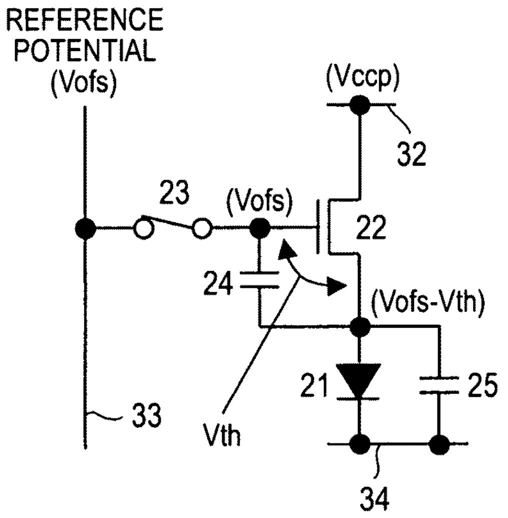

At time t13, when the potential DS of power supply line 32 is changed from the low potential Vini to the high potential Vccp as shown in FIG. 4D, the threshold correcting process is started in the state where the gate potential Vg of the driving transistor 22 is held. That is, the source potential Vs of the driving transistor 22 starts its rising toward the potential obtained by subtracting the threshold voltage Vth of the driving transistor 22 from the gate potential Vg.

Here, the process of changing the source potential Vs toward the potential obtained by subtracting the threshold voltage Vth of the driving transistor 22 from the initial potential Vofs with respect to the initial potential Vofs of the gate electrode of the driving transistor 22 is called the threshold correcting process. When this threshold correcting process is performed, the gate-source voltage Vgs of the driving transistor 22 finally converges on the threshold voltage Vth of the driving transistor 22. The voltage corresponding to the threshold voltage Vth is retained in the retention capacitor 24.

In the period (threshold correction period) in which the threshold correcting process is performed, in order to cause the current to flow only to the retention capacitor 24 but not to flow to the organic EL element 21, the potential Vcath of the common power supply line 34 is set to turn off the organic EL element 21.

Figure 5A:
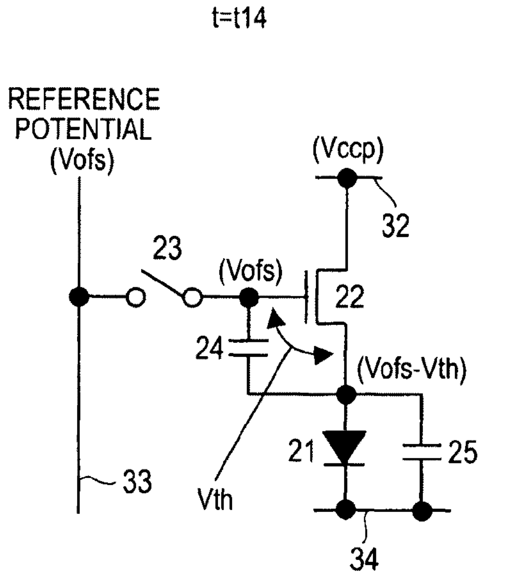
FIGS. 5A to 5D are (second) diagrams illustrating the basic circuit operation of the organic EL display device according to the embodiment of the invention.

At time t14, the potential WS of the scanning line 31 is changed to a low potential and thus the writing transistor 23 is turned off as shown in FIG. 5A. At this time, the gate electrode of the driving transistor 22 is electrically disconnected from the signal line 33 and is changed to a floating state. However, since the gate-source voltage Vgs is equal to the threshold voltage Vth of the driving transistor 22, the driving transistor 22 is in the cut-off state. Accordingly, the drain-source current Ids does not flow in the driving transistor 22.

(Signal Writing & and Mobility Correction Period)

Figure 5B:
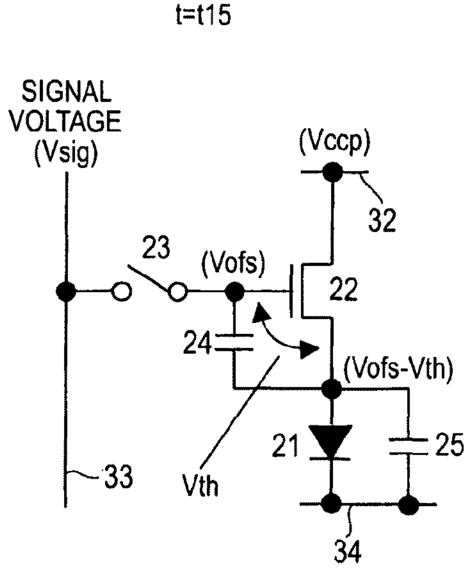
Figure 5C:
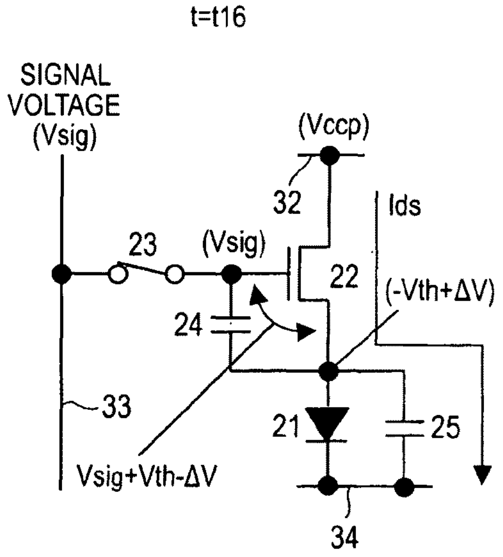

At time t15, the potential of the signal line 33 is changed from the reference potential Vofs to the signal voltage Vsig of the image signal, as shown in FIG. 5B. Subsequently, at time t16, the potential WS of the scanning line 31 is changed to a high potential, and the writing transistor 23 is turned on to sample the signal voltage Vsig of the mage signal and writes the sampled signal voltage to the pixel 20, as shown in FIG. 5C.

By causing the writing transistor 23 to write the signal voltage Vsig, th gate potential Vg of the driving transistor 22 becomes the signal voltage Vsig. At the time of driving the driving transistor 22 with the signal voltage Vsig of the image signal, the threshold voltage Vth of the driving transistor 22 is cancelled by the voltage corresponding to the threshold voltage Vth retained in the retention capacitor 24. The principle of this threshold canceling will be described later in detail.

At this time, the organic EL element 21 is in the cut-off state (high-impedance state). Accordingly, the current (drain-source current Ids) flowing to the driving transistor 22 from the power supply line 32 on the basis of the signal voltage Vsig of the image signal flows to the equivalent capacitor 25 of the organic EL element 21 and the charging of the equivalent capacitor 25 is started.

By charging the equivalent capacitor 25 of the organic EL element 21, the source potential Vs of the driving transistor 22 rises with the lapse of time. At this time, the variation of the threshold voltage Vth of the driving transistor 22 among the pixels is cancelled and the drain-source current Ids of the driving transistor 22 depends on the mobility μ of the driving transistor 22.

Here, it is assumed that the ratio of the retention voltage Vgs of the retention capacitor 24 to the signal voltage Vsig of the image signal, that is, the writing gain G is 1 (ideal value). Then, the source potential Vs of the driving transistor 22 rises up to the potential of Vofs−Vth+ΔV and thus the gate-source voltage Vgs of the driving transistor 22 becomes Vsig−Vofs+Vth−ΔV.

That is, the rising amount ΔV of the source potential Vs of the driving transistor 22 is subtracted from the voltage (Vsig−Vofs+Vth) retained in the retention capacitor 24. In other words, the electric charges charged in the retention capacitor 24 are discharged, which means to apply a negative feedback. Therefore, the rising amount ΔV of the source potential Vs is a feedback value of the negative feedback.

In this way, by applying the negative feedback to the gate-source voltage Vgs with the feedback value ΔV corresponding to the drain-source current Ids flowing in the driving transistor 22, the dependency of the drain-source current Ids of the driving transistor 22 on the mobility μ can be removed. This removal process is the mobility correcting process of correcting the variation of the mobility μ of the driving transistor 22 among the pixels.

More specifically, as the signal amplitude Vin (=Vsig−Vofs) of the image signal written to the gate electrode of the driving transistor 22 increases, the drain-source current Ids increases, and thus the feedback value ΔV of the negative feedback also increases. Accordingly, the mobility correcting process is performed depending on the emission brightness level.

When the signal amplitude Vin of the image signal is constant, the absolute value of the feedback value ΔV of the negative feedback increases as the mobility μ of the driving transistor 22 increases, whereby the variation of the mobility μ among the pixels can be removed. Accordingly, the feedback value ΔV of the negative feedback can be said to be a correction degree of the mobility correction. The details of the mobility correction process will be described later.

(Emission Period)

Figure 5D:
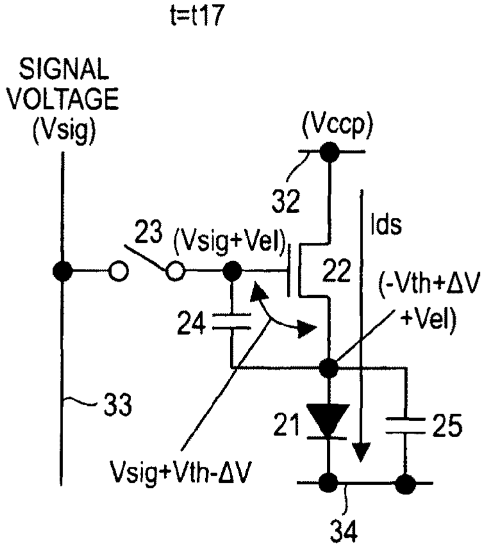

At time t17, the potential WS of the scanning line 31 is changed to a low potential and thus the writing transistor 23 is turned off as shown in FIG. 5D. Accordingly, the gate electrode of the driving transistor 22 is electrically disconnected from the signal line 33 and thus becomes the floating state.

Here, when the gate electrode of the driving transistor 22 is in the floating state, the retention capacitor 24 is connected between the gate and the source of the driving transistor 22, and thus the gate potential Vg also varies with the variation of the source potential Vs of the driving transistor 22. In this way, the operation that the gate potential Vg of the driving transistor 22 varies with the variation of the source potential Vs is a bootstrap operation of the retention capacitor 24.

The gate electrode of the driving transistor 22 becomes the floating state and the drain-source current Ids of the driving transistor 22 starts its flowing to the organic EL element 21 at the same time, whereby the anode potential of the organic EL element 21 rises with the current Ids.

When the anode potential of the organic EL element 21 is greater than Vthel+Vcath, the driving current starts flowing to the organic EL element 21, whereby the organic EL element 21 starts emitting light. The rising of the anode potential of the organic EL element 21 means the rising of the source potential Vs of the driving transistor 22. When the source potential Vs of the driving transistor 22 rises, the gate potential Vs of the driving transistor 22 also rises by the bootstrap operation of the retention capacitor 24.

At this time, when it is assumed that the bootstrap gain is 1 (ideal value), the rising amount of the gate potential Vg is equal to the rising amount of the source potential Vs. Accordingly, the gate-source voltage Vgs of the driving transistor 22 is maintained constant at Vsig−Vofs+Vth−ΔV. in the emission period. At time t18, the potential of the signal line 33 is changed from the signal voltage Vsig of the image signal to the reference potential Vofs.

In the above-mentioned circuit operations, the threshold correction preparation process, the threshold correcting process, the signal voltage Vsig writing (signal writing) process, and the mobility correcting process are performed in one horizontal scanning period (1H). The signal writing process and the mobility correcting process are performed in parallel in the period of time t6 to t7.

Here, the driving method of performing the threshold correcting process only once is employed, but this driving method is only an example. The invention is not limited to this driving method. For example, a driving method of divisional threshold correction may be employed in which the threshold correcting process is divided and performed plural times over plural horizontal scanning periods prior to a 1H period in addition to the 1H period in which the threshold correcting process is performed along with the mobility correcting process and the signal writing process.

By employing the driving method of divisional threshold correction, the threshold correction period can be sufficiently guaranteed over plural horizontal scanning periods even when the time allocated to a horizontal scanning period is shortened with an increase in pixels due to an increase in resolution, thereby satisfactorily performing the threshold correcting process.

(Principle of Threshold Cancel)

Here, the principle of threshold cancel (that is, threshold correction) of the driving transistor 22 will be described. Since the driving transistor 22 is designed to operate in the saturated region, it serves as a constant current source. Accordingly, the organic EL element 21 is supplied with a constant drain-source current (driving current) Ids expressed by Expression 1 from the driving transistor 22.

$$Ids=(1/2)\cdot\mu(W/L)Cox(Vgs-Vth)^2 \quad \text{Expression 1}$$

Here, W represents the channel width of the driving transistor 22, L represents the channel length, and Cox represents the gate capacity per unit area.

Figure 6:
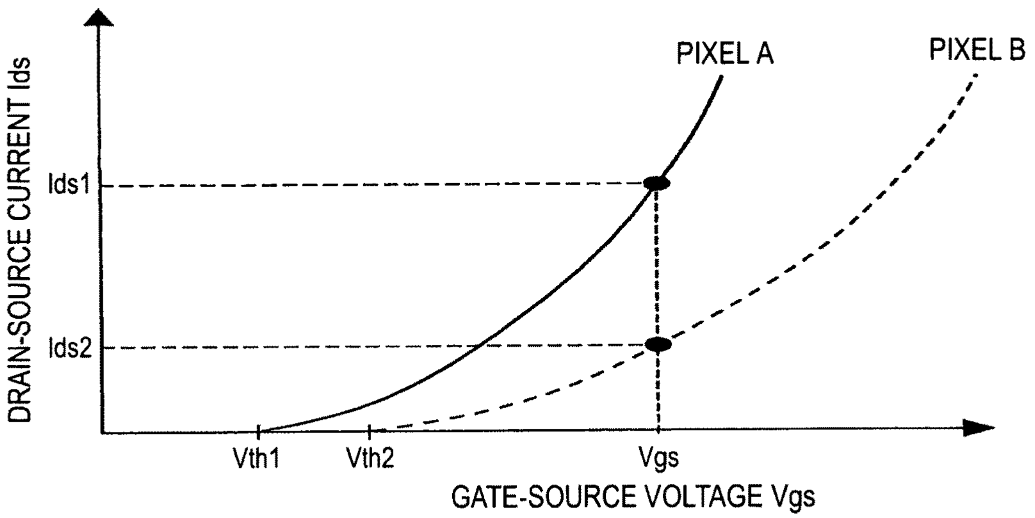
FIG. 6 is a characteristic diagram illustrating a problem due to a variation in threshold voltage of driving transistors.

FIG. 6 shows the characteristic of the drain-source current Ids vs. the gate-source voltage Vgs in the driving transistor 22.

As can be seen from the drawing, when the process of canceling the variation of the threshold voltage Vth of the driving transistor 22 among the pixels is not performed, the threshold voltage Vth is Vth1 and the drain-source current Ids corresponding to the gate-source voltage Vgs is Ids1.

On the contrary, when the threshold voltage Vth is Vth2 (Vth2>Vth1), the drain-source current Ids corresponding to the gate-source voltage Vgs is Ids2 (Ids2<Ids1). That is, when the threshold voltage Vth of the driving transistor 22 varies, the drain-source current Ids varies even if the gate-source voltage Vgs is constant.

On the other hand, in the pixel (pixel circuit) 20 having the above-mentioned configuration, the gate-source voltage Vgs of the driving transistor 22 at the time of emitting light is Vsig−Vofs+Vth−ΔV. Accordingly, by inserting this into Expression 1, the drain-source current Ids is expressed by Expression 2.

$$Ids=(1/2)\cdot\mu(W/L)Cox(Vsig-Vofs-\Delta V)^2 \quad \text{Expression 2}$$

That is, the term of the threshold voltage Vth of the driving transistor 22 is cancelled and thus the drain-source current Ids supplied to the organic EL element 21 from the driving transistor 22 does not depend on the threshold voltage Vth of the driving transistor 22. As a result, even when the threshold voltage Vth of the driving transistor 22 varies among the pixels due to the difference in manufacturing process of the driving transistor 22 or the temporal variation thereof, the drain-source current Ids does not vary, whereby the emission brightness of the organic EL element 21 can be kept constant.

(Principle of Mobility Correction)

Figure 7:
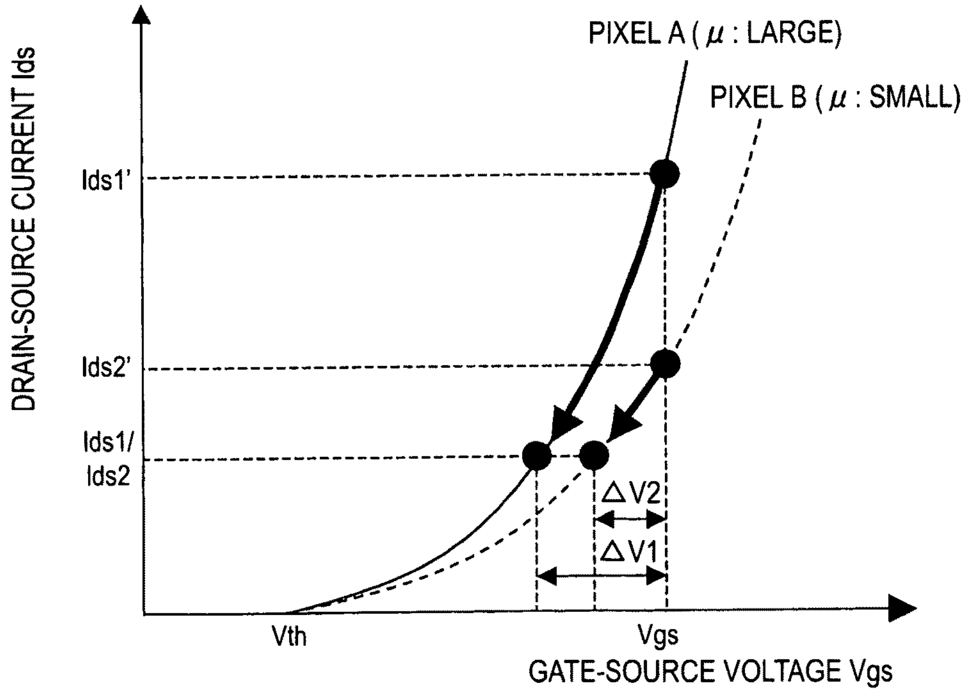
FIG. 7 is a characteristic diagram illustrating a problem due to a variation in mobility of the driving transistors.

The principle of mobility correction of the driving transistor 22 will be described. FIG. 7 shows characteristic curves of pixel A in which the mobility μ of the driving transistor 22 is relatively large and pixel B in which the mobility μ of the driving transistor 22 is relatively small for comparison. When the driving transistor 22 is formed by a polysilicon thin film transistor, the mobility μ is inevitably different between the pixels such as between pixel A and pixel B.

It is considered that the same level of signal amplitude Vin (=Vsig−Vofs) is written to the gate electrodes of the driving transistors 22 of both pixels A and B in the state where the difference in the mobility μ exists between pixel A and pixel B. In this case, when the mobility μ is not corrected at all, the drain-source current Ids1' flowing in pixel A having the relative large mobility μ and the drain-source current ids2' flowing in pixel B having the relatively small mobility μ are greatly different from each other. In this way, when the drain-source current Ids greatly varies between the pixels due to the variation of the mobility μ between the pixels, the uniformity of the screen is damaged.

Here, as can be clearly seen from the transistor characteristic expression of Expression 1, when the mobility μ is large, the drain-source current Ids increases. Accordingly, the feedback value ΔV of the negative feedback increases as the mobility μ decreases. As shown in FIG. 7, the feedback value ΔV1 of pixel A having the relative large mobility μ is larger than the feedback value ΔV2 of pixel B having the relatively small mobility μ.

Therefore, by applying the negative feedback to the gate-source voltage Vgs with the feedback value ΔV corresponding to the drain-source current Ids of the driving transistor 22 through the mobility correcting process, the negative feedback is more greatly applied as the mobility μ increases. As a result, the variation of the mobility μ among the pixels can be suppressed.

Specifically, when a correction with the feedback value ΔV1 is made on pixel A having the relatively large mobility μ, the drain-source current Ids greatly falls from Ids1' to Ids1. On the other hand, since the feedback value ΔV2 of pixel B having the relatively small mobility μ is small, the drain-source current Ids falls from Ids2' to Ids2, which is not relatively great. As a result, since the drain-source current Ids1 of pixel A and the drain-source current Ids2 of pixel B becomes roughly equal, the variation of the mobility μ between the pixels is corrected.

In brief, when pixel A and pixel B having different mobility μ exist, the feedback value ΔV1 of pixel A having the relatively mobility μ is greater than the feedback value ΔV2 of pixel B having the relative small mobility μ. That is, as the mobility μ of the pixel becomes greater, the feedback value ΔV of a pixel becomes greater and the falling amount of the drain-source current Ids becomes greater.

Therefore, by applying the negative feedback to the gate-source voltage Vgs with the feedback value ΔV corresponding to the drain-source current Ids of the driving transistor 22, the current values of the drain-source current Ids of the pixels having different mobility μ are uniformized. As a result, it is possible to correct the variation of the mobility μ among the pixels. That is, the process of applying the negative feedback to the gate-source voltage Vgs of the driving transistor 22 with the feedback value ΔV corresponding to the current (drain-source current Ids) flowing in the driving transistor 22 is the mobility correcting process.

Here, in the pixel (pixel circuit) 20 shown in FIG. 2, the relation of the signal voltage Vsig of the image signal and the drain-source current Ids of the driving transistor 22 depending on the threshold correction and the mobility correction will be described with reference to FIGS. 8A to 8C.

Figure 8A:
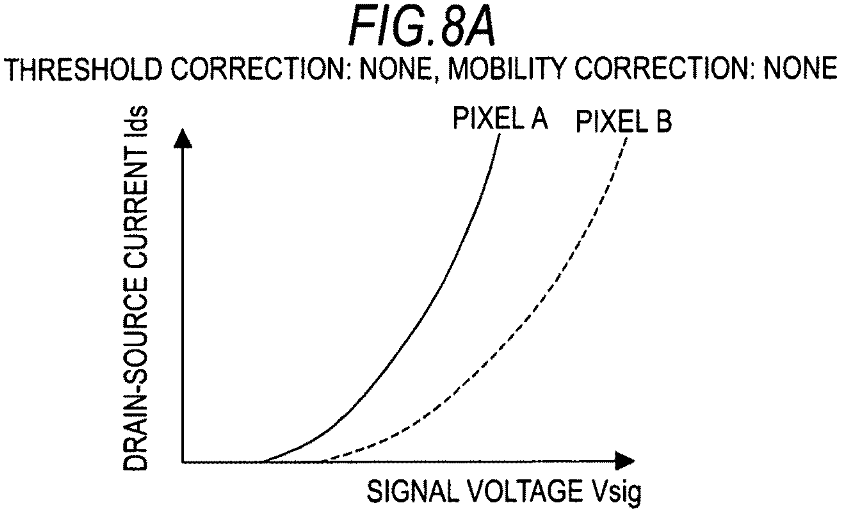
FIGS. 8A to 8C are characteristic diagrams illustrating the relation between a signal voltage of an image signal and drain-source current of the driving transistor depending on the threshold voltage correction and the mobility correction.
Figure 8B:
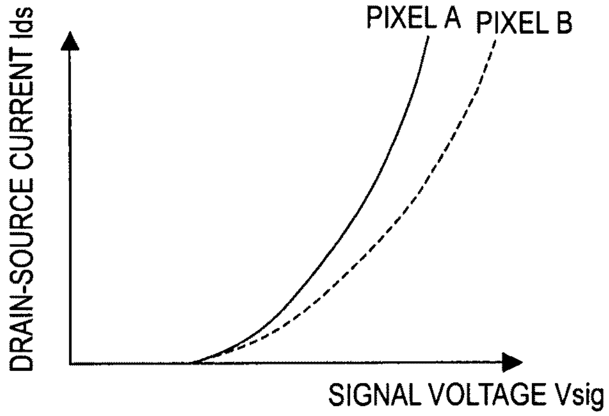
Figure 8C:
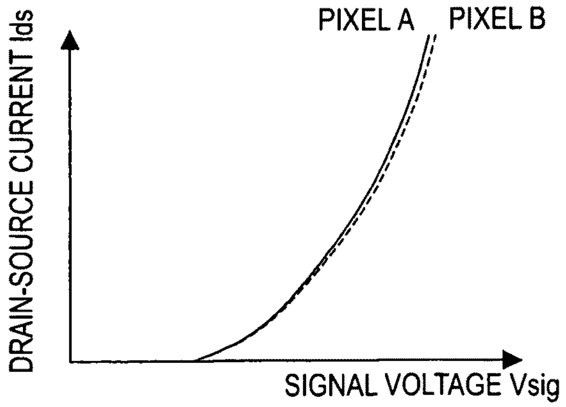

In FIGS. 8A to 8C, FIG. 8A shows an example where both the threshold correcting process and the mobility correcting process are not performed, FIG. 8B shows an example where the mobility correcting process is not performed but the threshold correcting process is performed, and FIG. 8C shows an example where both the threshold correcting process and the mobility correcting process are performed. As shown in FIG. 8A, when both the threshold correcting process and the mobility correcting process are not performed, the drain-source current Ids greatly varies between pixel A and pixel B due to the variations of the threshold voltage Vth and the mobility μ between pixels A and B.

On the contrary, when only the threshold correcting process is performed as shown in FIG. 8B, the variation of the drain-source current Ids can be reduced to a certain extent, but the variation of the drain-source current Ids between pixels A and B due to the variation of the mobility μ between pixels A and B remains. By performing both the threshold correcting process and the mobility correcting process, as shown in FIG. 8C, the difference of the drain-source current Ids between the pixels A and B due to the variations of the threshold voltage Vth and the mobility μ between pixels A and B can be almost cancelled. Therefore, the uneven brightness of the organic EL elements 21 is not caused in any gray scale, thereby obtaining a display image with high quality.

Since the pixel 20 shown in FIG. 2 has the function of the bootstrap operation of the retention capacitor 24 in addition to the threshold correcting function and the mobility correcting function, the following operational advantages can be obtained.

That is, even when the source potential Vs of the driving transistor 22 varies with the temporal variation of the I-V characteristic of the organic EL element 21, the gate-source potential Vgs of the driving transistor 22 can be kept constant with the bootstrap operation of the retention capacitor 24. Therefore, the current flowing in the organic EL element 21 does not vary but is kept constant. As a result, the emission brightness of the organic EL element 21 is kept constant. Even when the I-V characteristic of the organic EL element 21 varies with the lapse of time, it is possible to realize the image display without the brightness deterioration.

2. IMAGE BURN-IN PHENOMENON

2-1. Image Burn-In Phenomenon Due to Brightness Deterioration of Organic EL Element As described above, the brightness of the organic EL element 21 is deteriorated depending on the emission state thereof. In the organic EL display device, since the brightness of the organic EL elements in a deteriorated specific display area is deteriorated relative to the organic EL elements in the other display area, an image burn-in phenomenon that the display of the specific display area is recognized as fixed uneven brightness occurs.

Here, the specific display area in which the organic EL elements are more rapidly deteriorated means an area in which an image of a fixed pattern is repeatedly displayed such as time display (clock display). To prevent this image burn-in phenomenon, the organic EL display device 10 has a function (image burn-in correcting function) of correcting the image burn-in phenomenon in terms of signal processing.

In correcting the image burn-in phenomenon in terms of signal processing, dummy pixels not contributing to an image display are disposed outside the pixel array unit (display area) 30 of the display panel 70, and the dummy pixels are driven in the same manner as the effective pixels (pixel 20) to deteriorate the brightness thereof. The brightness deterioration states of the dummy pixels are detected by the use of an optical sensor.

By forming the dummy pixels on the same display panel 70 as the effective pixels 20 contributing to an image display and driving the dummy pixels basically in the same manner as the effective pixels 20, it is possible to predict the brightness deterioration state of the pixels 20 from the brightness deterioration state of the dummy pixels. Therefore, by detecting the brightness deterioration state of the dummy pixels and controlling the brightness of the pixels 20 in the specific display area in which the image burn-in phenomenon occurs on the basis of the detection result, it is possible to perform the image burn-in correcting process for not causing the image burn-in phenomenon.

The dummy pixels have the same configuration as the pixels 20 of the pixel array unit 30. That is, each dummy pixel includes an organic EL element, a driving transistor, a writing transistor, and a retention capacitor, similarly to the pixel 20. Accordingly, since the dummy pixels can be manufactured by the same processes as the pixels 20, the increase in difficulty level of productivity of the display panel 70 or the increase in cost due to the dummy pixels are hardly caused.

2-2. Image Burn-In Phenomenon Due to Current Deterioration

As described above, the transistors (the driving transistor 22 and the writing transistor 23) in the pixel 20 change their transistor characteristics by the application different color light other than the emission color of the corresponding pixel. Blue light (B light) out of the different color light have greater energy than those of the other red light (R light) and green light (G light). Accordingly, the characteristics of the transistors in the pixels 20 can easily vary by the application of the blue light out of the different color light.

Here, the writing transistor 23 out of the transistors in the pixels 20 will be described particularly. In the emission period of the organic EL element 21, the writing transistor 23 is turned off by applying a negative bias voltage of, for example, about −3 V to the gate electrode of the writing transistor 23. In the emission period, since current flows in the organic EL element 21, the anode potential of the organic EL element 21 (the source potential of the driving transistor 22) rises up to a predetermined potential, for example, about 5 V.

When the signal voltage Vsig of a white gray scale is set to, for example, 5 V at the time of displaying the white gray scale, the gate potential of the driving transistor 22 is about 10 V, which is higher by 5 V than the source potential. On the other hand, when the pixel row is in the emission period, the signal voltage Vsig of the image signal is written to the other pixel rows and the potential (source potential) of the writing transistor 23 close to the signal line 33 becomes a potential of about 0 to 6V due to the potential of the signal line 33.

Accordingly, the voltage of about −3 V is applied to the gate electrode of the writing transistor 23 and the voltage of about 0 to 6 V is applied to the electrode (source electrode) close to the signal line 33. As a result, the negative bias is applied to the writing transistor 23 and a high voltage of about 13 V is applied between the gate and the drain. Here, the negative bias means a bias state where the gate potential is minus relative to the source potential.

The transistor characteristic of the writing transistor 23, that is, the threshold voltage Vth (hereinafter, referred to as "Vth characteristic"), varies to a lower level due the negative bias. That is, the Vth characteristic of the writing transistor 23 is shifted from enhancement to depression. Here, the enhancement means a state where a channel is formed and current flows between the source and the drain with the application of the writing pulse (scanning signal) WS to the gate electrode. The depression means a state where current flows between the source and the drain without applying the writing pulse WS to the gate electrode.

Figure 9:
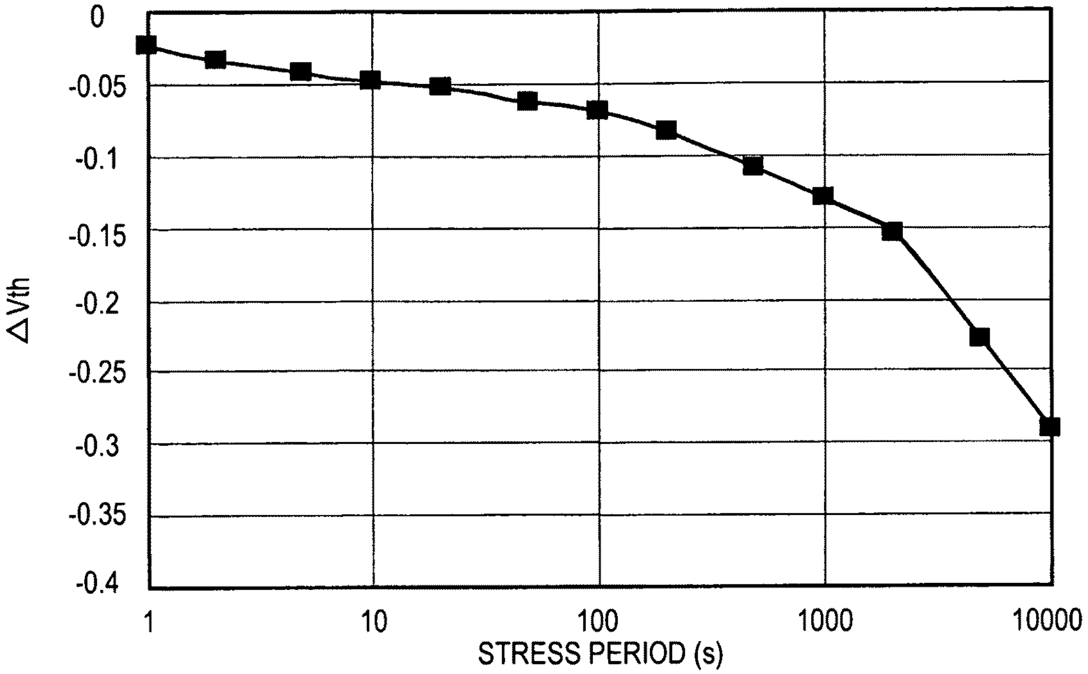
FIG. 9 is a diagram illustrating a variation characteristic of the threshold voltage at the time of applying a negative bias.

FIG. 9 shows an example of the variation characteristic of the threshold voltage Vth at the time of applying the negative bias. In FIG. 9, the horizontal axis represents a stress time for applying the negative bias to the gate electrode of the writing transistor 23 and the vertical axis represents the variation ΔVth of the threshold voltage Vth. As can be clearly seen from the drawing, the threshold voltage Vth falls as the stress time increases.

The optimal correction time t of the mobility correction is given by Expression 3.

$$t=C/(k\mu Vsig) \qquad \text{Expression 3}$$

Here, the constant k is k=(1/2)(W/L)Cox. C represents the capacitance of the node to be discharged at the time of correcting the mobility and is the combined capacitance of the equivalent capacitor of the organic EL element 21 and the retention capacitor 24 in the pixel circuit shown in FIG. 2.

The optimal correction time t of the mobile correction is determined as the time when the writing transistor 23 is changed from the turn-on state to the turn-off state. The writing transistor 23 is cut off, that is, changed from the turn-on state to the turn-off state, when the potential between the gate potential and the potential of the signal line 33, that is, the gate-source voltage, is equal to the threshold voltage Vth.

The applicant confirmed that the dependency of the drain-source current Ids of the driving transistor 22 on the mobility μ could be satisfactorily cancelled by setting the correction time t of the mobility correction to be reversely proportional to the signal voltage Vsig of the image signal. More specifically, by setting the correction time t to be shorter when the signal voltage Vsig is great and setting the correction time t to be longer when the signal voltage Vsig is small, it is possible to more satisfactorily correct the variation of the mobility μ among the pixels.

Figure 10:
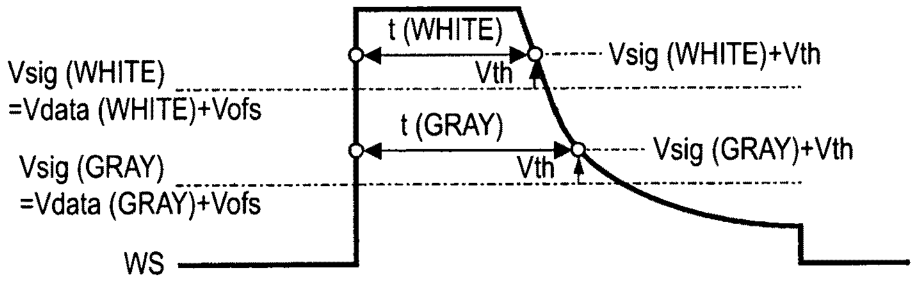
FIG. 10 is a waveform diagram illustrating the relation between a rising waveform of a writing pulse and an optimal correction time of the mobility correction.

Accordingly, the falling waveform at the time of changing the writing pulse WS applied to the gate electrode of the writing transistor 23 from a high level to a low level is set to a waveform which is reversely proportional to the signal voltage Vsig of the image signal, as shown in FIG. 10. When the writing transistor 23 is a P-channel type, the rising waveform is set to the waveform which is reversely proportional to the signal voltage Vsig.

By setting the falling waveform of the writing pulse WS to the waveform which is reversely proportional to the signal voltage Vsig of the image signal, the writing transistor 23 is cut off when the gate-source voltage of the writing transistor 23 is equal to the threshold voltage Vth. Accordingly, it is possible to set the optimal correction time of the mobility correction to be reversely proportional to the signal voltage Vsig of the image signal.

Specifically, as can be clearly seen from FIG. 10, when the signal voltage is Vsig (white) corresponding to a white level, the writing transistor 23 is cut off when the gate-source voltage is Vsig (white)+Vth. Accordingly, the correction time t (white) of the mobility correction is set to be shortest. When the signal voltage is Vsig (gray) corresponding to a gray level, the writing transistor 23 is cut off when the gate-source voltage is Vsig (gray)+Vth. Accordingly, the correction time t (gray) is set to be longer than the correction time t (white).

In this way, by setting the optimal correction time t of the mobility correction to be reversely proportional to the signal voltage Vsig of the image signal, it is possible to set the optimal correction time t depending on the signal voltage Vsig. As a result, the dependency of the drain-source current Ids of the driving transistor 22 on the mobility μ can be more satisfactorily cancelled over the entire level range (entire gray-scale) of the signal voltage Vsig from a black level to a white level. That is, it is possible to more satisfactorily correct the variation of the mobility μ among the pixels.

Figure 11:
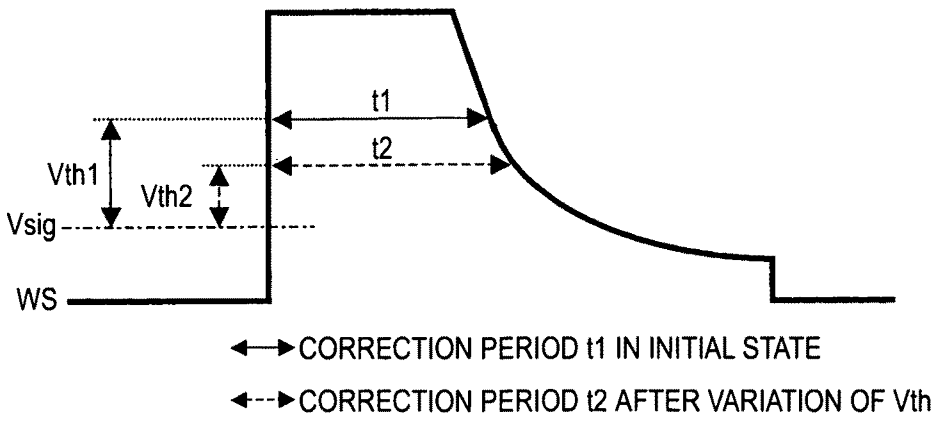
FIG. 11 is a waveform diagram illustrating a problem based on a shift of the Vth characteristic of a writing transistor to depression due to the negative bias in an emission period.

Here, as described above, it is considered that the Vth characteristic of the writing transistor 23 is shifted to the depression due to the negative bias in the emission period. Specifically, as shown in FIG. 11, when the threshold voltage Vth of the writing transistor 23 is changed from the initial state of Vth1 to Vth2 lower than the initial state, the operating point of the mobility correction is changed and the optimal correction time t of the mobility correction is changed from the initial time t1 to t2 longer than the initial time.

When the optimal correction time t of the mobility correction becomes longer, the mobility is excessively corrected. Here, the emission current (driving current) Ids of the organic EL element 21 is given by Expression 4.

$$Ids=k\mu(Vsig/(1+Vsig(k\mu/C)t))^2 \qquad \text{Expression 4}$$

As can be seen from Expression 4, when the optimal correction time t of the mobility correction increases and the mobility is excessively corrected, the emission current Ids of the organic EL element 21 slowly decreases. This current deterioration is a factor for the image burn-in phenomenon.

2-3. Brightness Deterioration Due to Influence of Blue Light

Figure 12:
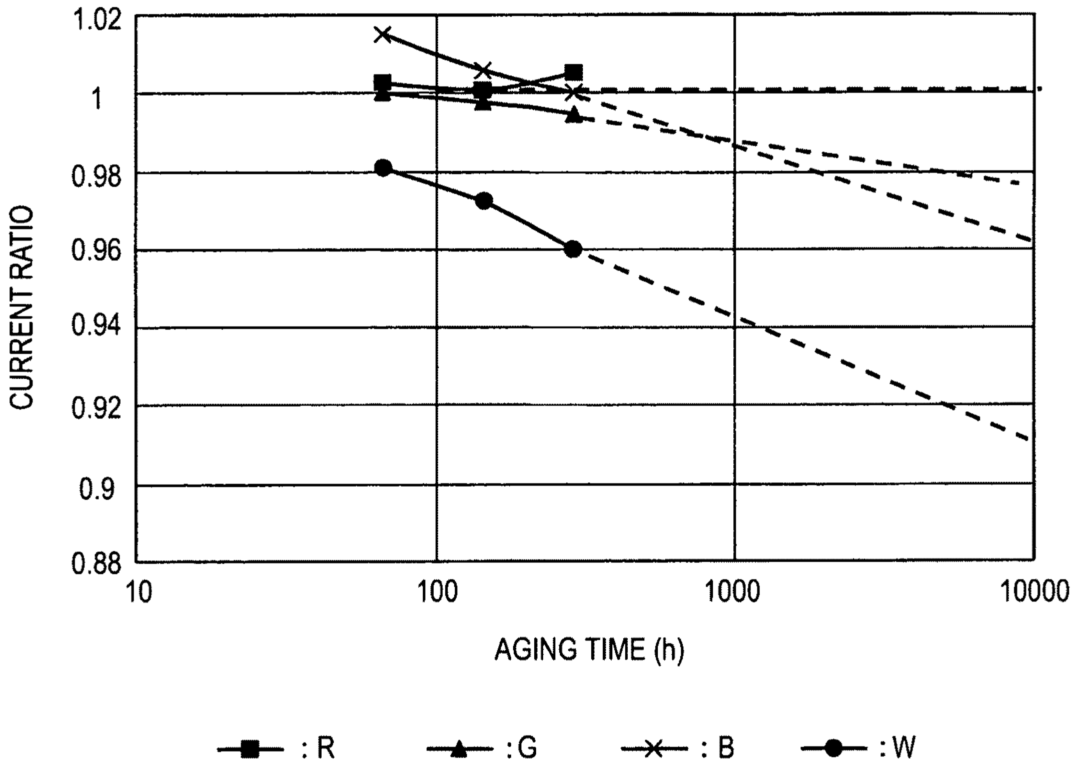
FIG. 12 is a diagram illustrating a variation in brightness deterioration characteristic in green (G) pixels depending on display colors.

The Vth characteristic of the writing transistor 23 is shifted to the depression due to the application of different color light other than the emission color of the corresponding pixel, particularly, the blue light (B light), as well as the application of the negative bias. The brightness deterioration characteristic varies depending on the display colors due to the influence of the blue light. Specifically, the brightness deterioration characteristic of a green (G) pixel varies in a G display, a W (white) display, and a Cy (cyan) display, as shown in FIG. 12.

That is, in the G display, only the G light is emitted and thus the brightness is not influenced by the B light. On the contrary, in the W display, the R light, the G light, and the B light are emitted at the same time, and thus the brightness is influenced by the B light. In the W display, the brightness is influenced by the B light and thus the brightness deterioration speed increases in comparison with the G display.

Figure 13:
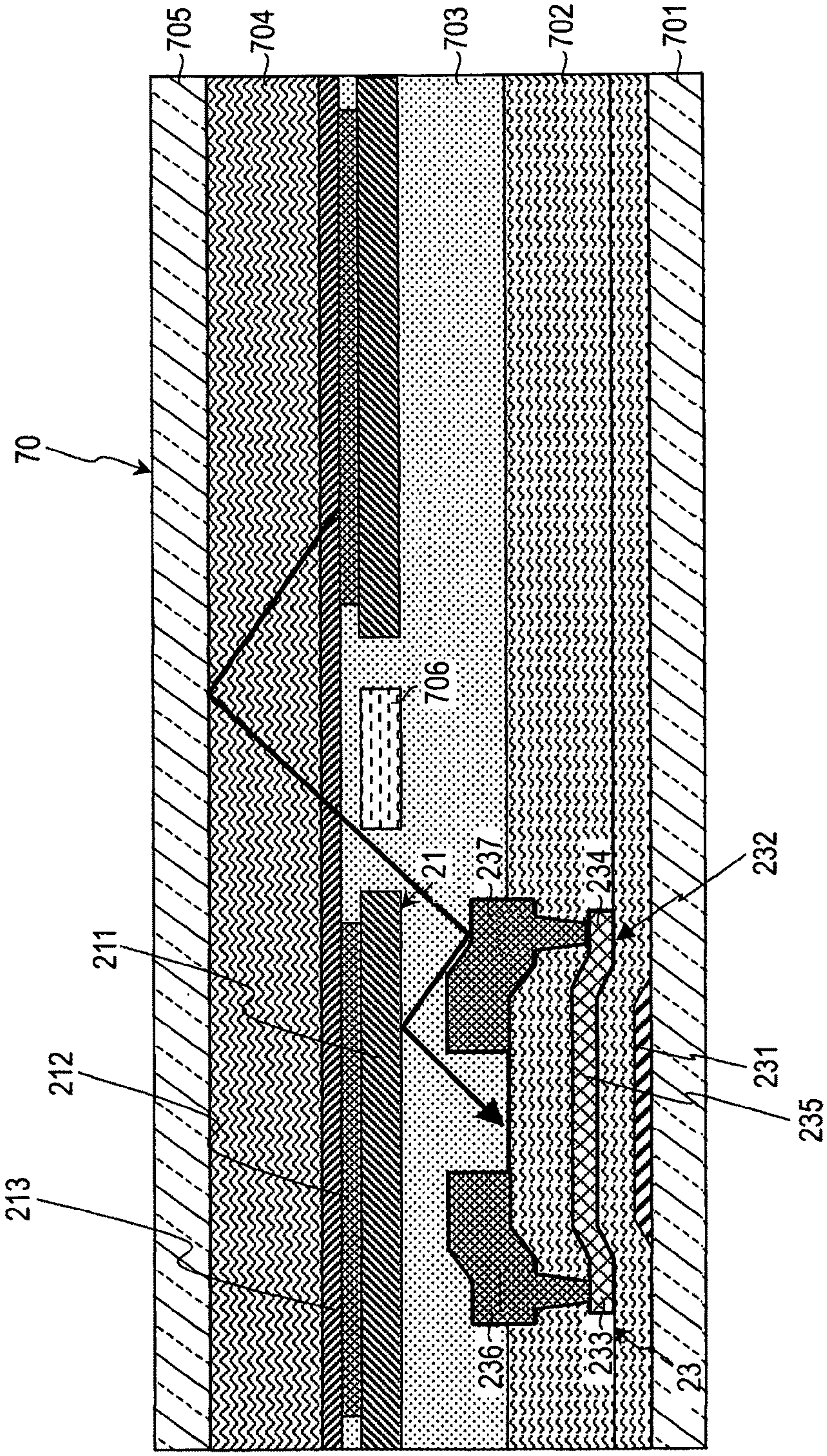
FIG. 13 is a sectional view of a pixel illustrating a mechanism of emitting blue (B) light.

Here, the mechanism of emitting the blue light will be described with reference to the sectional view of a pixel shown in FIG. 13.

First, the pixel structured shown in FIG. 13 will be described. As shown in FIG. 13, the driving circuit including the writing transistor 23 is formed on the glass substrate 701 as a transparent substrate. Here, only the writing transistor 23 out of the constituent elements of the driving circuit is shown and the other constituent elements are not shown.

The writing transistor 23 includes a gate electrode 231, source/drain regions 233 and 234 disposed on both sides of a polysilicon semiconductor layer 232, and a channel forming region 235 disposed in a portion of the polysilicon semiconductor layer 232 opposed to the gate electrode 231. Source/drain electrodes 236 and 237 are electrically connected to the source/drain regions 233 and 234.

An organic EL element 21 as a self-emission element is formed on the glass substrate 701 with an insulating film 702 and an insulating planarization film 703 interposed therebetween. The organic EL element 21 includes an anode electrode 211, an organic layer 212, and a cathode 213. The anode electrode 211 is formed of metal or the like, and the cathode electrode 213 is formed of a transparent conductive film formed in common to the entire pixels on the organic layer 212.

In this organic EL element 21, the organic layer 212 is formed by sequentially stacking a hole transport layer/hole injection layer, a light-emitting layer, an electron transport layer, and an electron injection layer on the anode electrode 211. Since current flows in the organic layer 212 via the anode electrode 211 under the current-driving with the driving transistor 22 shown in FIG. 2, light is emitted by the recombination of electrons and holes in the light emitting layer in the organic layer 212.

After the organic EL element 21 is formed in the unit of pixels on the glass substrate 701 with the insulating film 702 interposed therebetween, a glass substrate 705 as a transparent substrate is bonded thereto with a passivation film 704. The organic EL element 21 is sealed with the glass substrate 705, whereby the display panel 70 is formed.

The auxiliary lines 706 for applying a cathode potential Vcath to the effective pixels 20 of the pixel array unit 30 are arranged around the pixel array unit 30. The auxiliary lines 706 are arranged in a mesh shape among the pixels. Accordingly, the auxiliary lines 706 to lower the line resistance of the cathode line (corresponding to the common power supply line 34 in FIG. 2).

In the above-mentioned pixel structure, when the right pixel is an organic EL element 21 emitting blue light, the blue light emitted from the organic EL element 21 is internally scattered, reflected by interfaces of the glass substrate 705 or the like, and is incident on the writing transistor 23 of the neighboring pixel. By the incidence of the blue light from the neighboring pixel, the Vth characteristic of the writing transistor 23 is shifted to the depression due to the influence of the blue light.

When the Vth characteristic of the writing transistor 23 is shifted, the current flowing in the organic EL element 21 varies as described above. The variation in current serves as the current deterioration due to the application of different color light, for example, the blue light in this embodiment. The current deterioration causes the brightness deterioration of the organic EL element 21 as described above, and thus serves as a factor causing the image burn-in phenomenon. Therefore, in correcting the image burn-in, it is possible to make a correction in consideration of the image burn-in due to the current deterioration based on the application of the different color light.

3. EMBODIMENTS

As described above, since the brightness of the organic EL elements in the deteriorated specific display area is relatively lower than the organic EL elements in the other display area, the image burn-in phenomenon that the display of the specific display area is recognized as the fixed uneven brightness occurs in the organic EL display device. To solve the image burn-in phenomenon, the organic EL display device 10 has the function (image burn-in correcting function) of correcting the image burn-in phenomenon in terms of the signal processing.

In correcting the image burn-in phenomenon in terms of the signal processing, the dummy pixels not contributing to the image display are disposed outside the pixel array unit (display area) 30 on the display panel 70 and the dummy pixels are driven in the same manner as the effective pixels (pixel 20) in the display area, whereby the brightness is deteriorated. Then, the brightness deterioration state of the dummy pixels is detected by the optical sensor.

By forming the dummy pixels on the same display panel 70 as the effective pixels 20 contributing to the image display and driving the dummy pixels basically in the same manner as the effective pixels 20, the brightness deterioration state of the pixels 20 can be predicted on the basis of the brightness deterioration state of the dummy pixels. Therefore, by detecting the brightness deterioration state of the dummy pixels and controlling the brightness of the pixels 20 in the specific display area in which the image burn-in phenomenon occurs on the basis of the detection result, it is possible to correct the image burn-in.

The circuit (image burn-in correction circuit) of correcting the image burn-in according to this embodiment makes a correction in consideration of the image burn-in phenomenon due to the current deterioration based on the application of the different color light other than the emission color, particularly, the blue light, in addition to the image burn-in phenomenon due to the brightness deterioration of the organic EL element 21. Specifically, in detecting the brightness deterioration of the dummy pixel, predicting the brightness deterioration of the effective pixel (pixel 20) on the basis of the detection result, and calculating the correction degree of the image burn-in, the organic EL elements of the different color light are made to emit light at the same time as causing the organic EL elements of the emission color to be detected to emit light.

In this way, by causing the organic EL elements of the different color light to emit light as the same time as causing the organic EL elements of the emission color to be detected to emit light, the characteristic deterioration state of the transistor of the dummy pixel due to the application of the different color light in addition to the brightness deterioration state of the organic EL element can be also detected (monitored). By correcting the image burn-in on the basis of the detection result of the optical sensor, it is possible to make a correction in consideration of the image burn-in phenomenon due to the current deterioration based on the application of the different color light other than the emission color of the corresponding pixel in addition to the image burn-in phenomenon due to the brightness deterioration of the organic EL element 21.

3-1. Image Burn-In Correcting Circuit

A specific example of the image burn-in correcting circuit making a correction in consideration of the image burn-in phenomenon due to the current deterioration based on the application of the different color light (second color light) other than the emission color light (first color light) of the corresponding pixel in addition to the image burn-in phenomenon due to the brightness deterioration of the organic EL element 21 will be described below.

Figure 14:
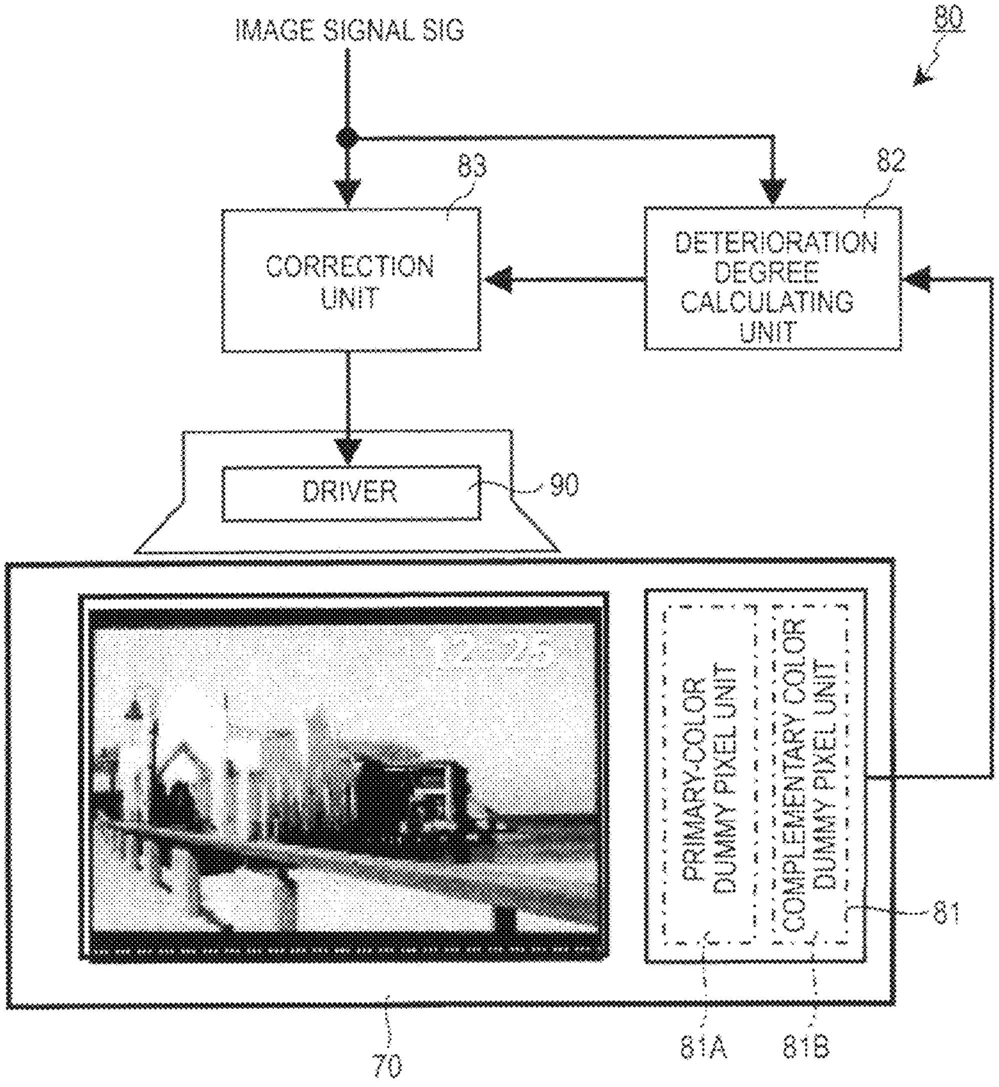
FIG. 14 is a block diagram illustrating the configuration of an image burn-in correcting circuit according to the embodiment of the invention.

FIG. 14 is a block diagram illustrating the configuration of the image burn-in correcting circuit according to this embodiment. Here, the organic EL display device employing the image burn-in correcting circuit according to this embodiment is a color display device in which the pixels (sub pixels) 20 of the pixel array unit 30 have three primary colors of R (red), G (green), and B (blue) as basic emission colors, respectively.

As shown in FIG. 14, the image burn-in correcting circuit 80 according to this embodiment includes a dummy pixel unit 81, a deterioration degree calculating unit 82, and a correction unit 83. The dummy pixel unit 81 is disposed outside the pixel array unit (display area) 30 on the display panel 70. The dummy pixel unit 81 includes a primary-color dummy pixel unit 81A of R, G, and B and a complementary-dummy pixel unit 81B of Cy (cyan) and Mg (magenta).

In the primary-color dummy pixel unit 81A, for example, an organic EL element of a G dummy pixel is caused to emit light and the brightness deterioration is detected. From this detection result, the brightness deterioration of the organic EL elements of the G effective pixels 20 can be predicted. In the complementary-color dummy pixel unit 81B, a G organic EL element and a B organic EL element of a Cy dummy pixel are caused to emit Cy light at the same time and the brightness deterioration is detected. From this detection result, the characteristic deterioration due to the application of the B light to the transistors constituting the G effective pixels 20 can be predicted.

Figure 15:
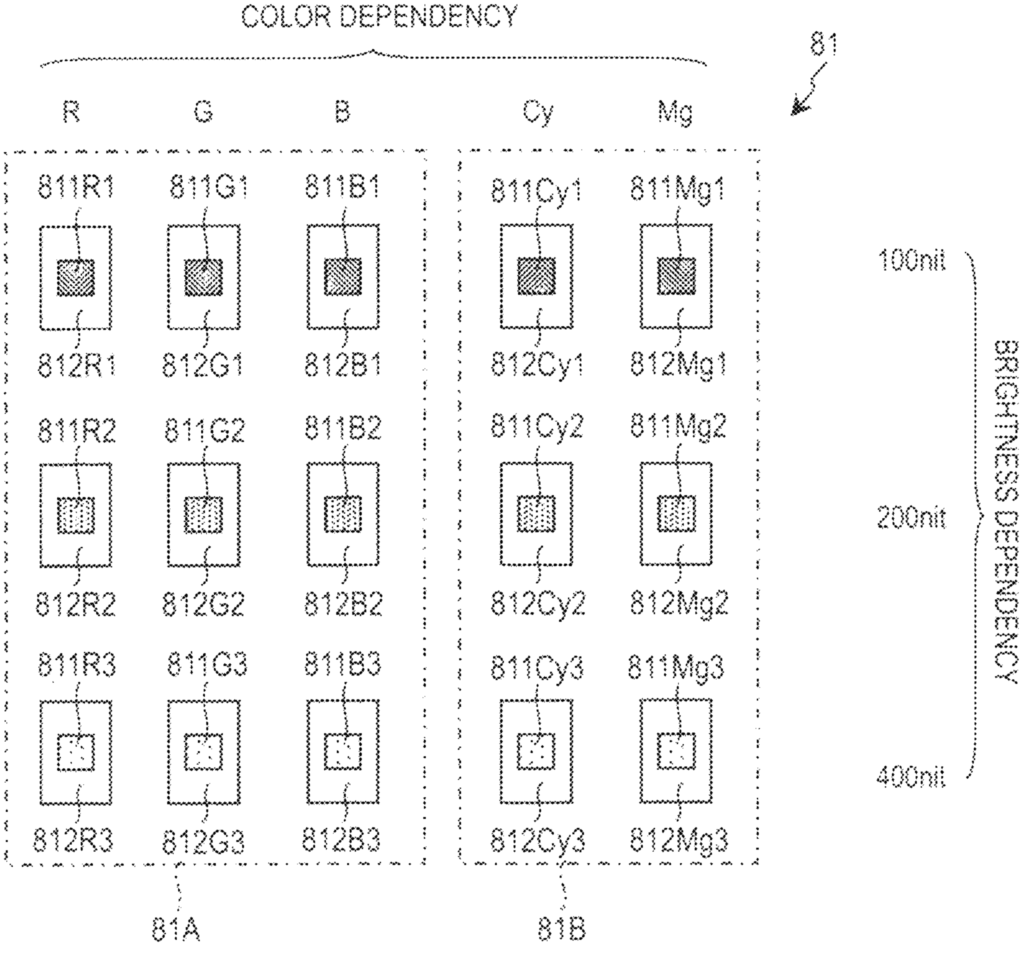
FIG. 15 is a diagram schematically illustrating the configuration of a dummy pixel unit.

FIG. 15 is a diagram schematically illustrating the specific configuration of the dummy pixel unit 81. As shown in FIG. 15, the dummy pixel unit 81 includes the primary-color dummy pixel unit 81A of R, G, and B and the complementary-color dummy pixel unit 81B of Cy and Mg.

The primary-color dummy pixel unit 81A includes dummy pixels 811R, 811G, and 811B of three colors corresponding to the effective pixels 20 of R, G, and B. That is, the dummy pixels 811R, 811G, and 811B have color dependency corresponding to the basic emission colors of the display area. The dummy pixels 811R, 811G, and 811B also have brightness dependency, because plural dummy pixels are disposed for each of plural different emission brightness values.

Specifically, the R dummy pixel 811R includes three dummy pixels 811R1, 811R2, and 811R3 to correspond to three types of emission brightness such as 100 nit, 200 nit, and 400 nit. Similarly, the G dummy pixel 811G includes three dummy pixels 811G1, 811G2, and 811G3 to correspond to three types of emission brightness, and the B dummy pixel 811B includes three dummy pixels 811B1, 811B2, and 811B3 to correspond to three types of emission brightness.

The R dummy pixels 811R1, 811R2, and 811R3, the G dummy pixels 811G1, 811G2, and 811G3, and the B dummy pixels 811B1, 811B2, and 811B3 are driven by display signals for the dummy pixels corresponding to the colors and three types of emission brightness. Here, the dummy pixels of the emission colors and the emission brightness values are comprehensively called dummy pixels 811A.

The primary dummy pixel unit 81A includes optical sensors 812A (812R1, 812R2, 812R3/812G1, 812G2, 812G3/812B1, 812B2, 812B3) in addition to the dummy pixels 811A. The optical sensors 812A measure the brightness of the dummy pixels 811A by detecting the light emitted from the dummy pixels 811A of the emission colors and the emission brightness values.

The complementary dummy pixel unit 81B includes Cy and Mg dummy pixels 811Cy and 811Mg. The Cy dummy pixel 811Cy includes at least an organic EL element emitting G light (first color light) and an organic EL element emitting B light (second color light), and emits Cy light by driving the G and B organic EL elements at the same time. The Mg dummy pixel 811Mg includes at least an organic EL element emitting R light (first color light) and an organic EL element emitting B light (second color light), and emits Mg blight by driving the R and B organic EL elements at the same time.

The dummy pixels 811Cy and 811Mg have the brightness dependency, similarly to the primary-color dummy pixels, because plural dummy pixels are disposed to correspond to plural different emission brightness values. Specifically, the Cy dummy pixel 811Cy includes three dummy pixels 811Cy1, 811Cy2, and 811Cy3 to correspond to three types of emission brightness. Similarly, the Mg dummy pixel. 811Mg includes three dummy pixels 811Mg1, 811Mg2, and 811Mg3 to correspond to three types of emission brightness. Hereinafter, the dummy pixels of the emission colors and the emission brightness values are called dummy pixels 811B.

The complementary-color dummy pixel unit 81B includes optical sensors 812B (812Cy1, 812Cy2, 812Cy3/812Mg1, 812Mg2, 812Mg3) in addition to the dummy pixels 811B. The optical sensors 812B measure the brightness of the dummy pixels 811B by detecting the light emitted from the dummy pixels 811B of the emission colors and the emission brightness values.

Here, a yellow dummy pixel is not provided to the complementary-color dummy pixel unit 81B, because R light and G light have a smaller influence on the transistors of the pixels than the B light. However, the yellow dummy pixel may be provided to the complementary-color dummy pixel unit 81B, of course.

The optical sensors 812A and 812B are disposed, for example, to face the emission surfaces of the dummy pixels 811A and 811B. A known optical sensor can be used as the optical sensor 812A and 812B. For example, a visible-light sensor using an amorphous silicon semiconductor can be used. The optical sensors 812A and 812B, for example, output the brightness information (light intensity information), which is detected as a current value, as a voltage value. The brightness information as the detection results of the optical sensors 812A and 812B is supplied to the deterioration degree calculating unit 82.

Figure 16:
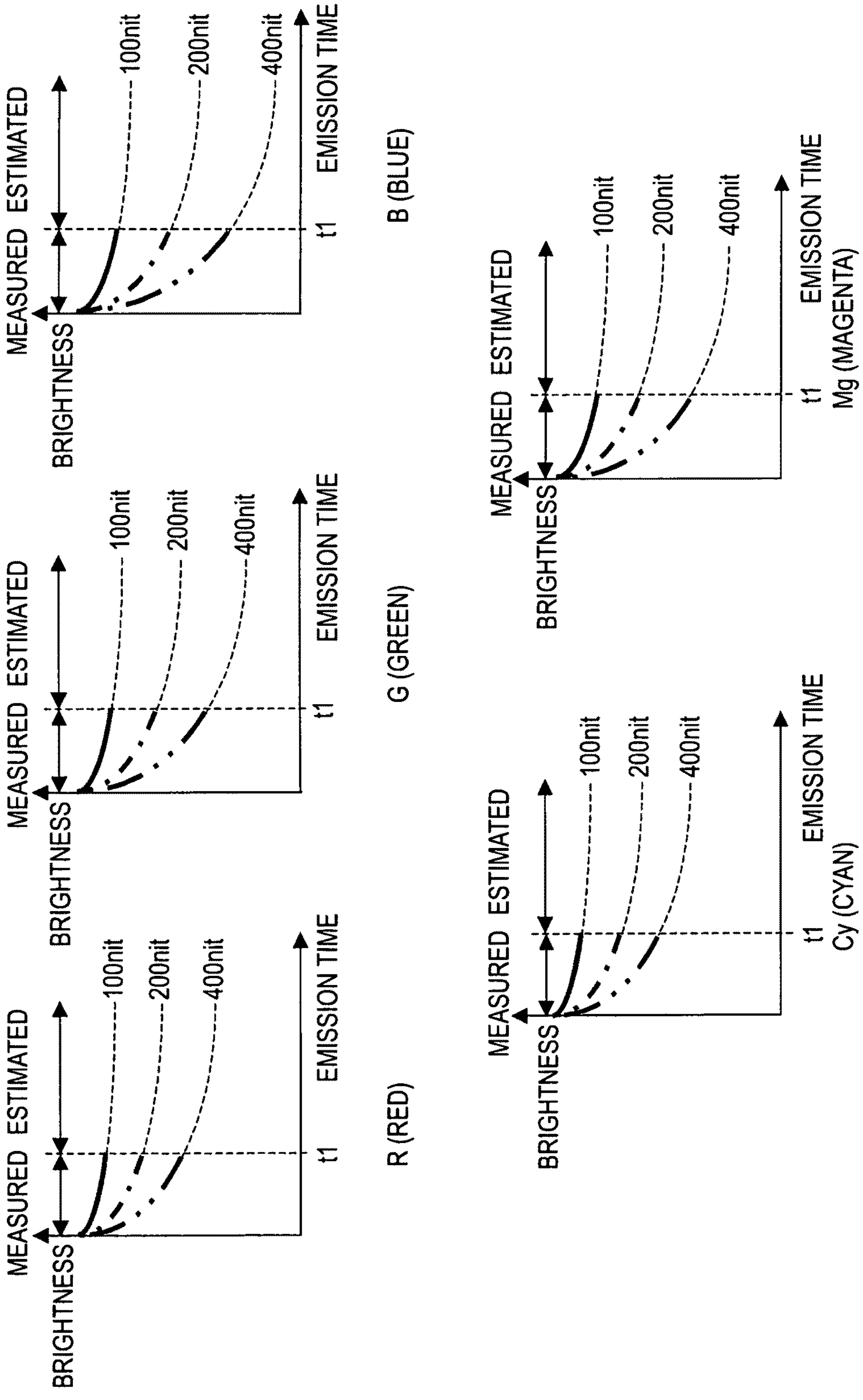
FIG. 16 is a diagram illustrating emission time-brightness characteristics for each brightness of 100 nit, 200 nit, and 400 nit in the emission colors of R, G, B, Cy, and Mg.

As described above, the organic EL elements as the self-emission elements of the dummy pixels 811A and 811B decrease in brightness efficiency in proportion to the emission brightness (emission amount) and the emission time. The degree of deterioration of the brightness efficiency varies depending on the emission colors. FIG. 16 shows the emission time-brightness characteristic for each each of 100 nit, 200 nit, and 400 nit with respect to the emission colors of R, G, B, Cy, and Mg. In FIG. 16, the measured characteristic is shown up to emission time t1 and the estimated characteristic is shown after time t1.

The deterioration degree calculating unit 82 detects the brightness deterioration characteristics in the emission colors of R, G, and B in the pixel array unit (display area) 30 from the detection results (brightness information) of the optical sensors 812A and 812B corresponding to the dummy pixels 811A and 811B of the emission colors and the emission brightness values. The detection of the brightness deterioration characteristic will be described in detail with reference to an example where the G pixel out of the effective pixels 20 of R, G, and B in the display area is a detection target.

In the dummy pixel unit 81, the Cy dummy pixel 811Cy including a set of the organic EL element emitting G light and the organic EL element emitting B light in addition to the G dummy pixel 811G as the detection target is made to emit light at the same time. In this state, the deterioration degree calculating unit 82 calculates the deterioration degree of the G dummy pixel 811G from the detection result-of the optical sensor 812G and calculate the deterioration degree of the Cy dummy pixel 811Cy from the detection result of the optical sensor 812Cy.

Here, since the G dummy pixel 811G has an emission state where only the G light is emitted, the deterioration degree calculated from the detection result of the optical sensor 821G is the deterioration degree of the organic EL element emitting the G light. The brightness deterioration of the organic EL elements of the G effective pixels 20 in the display area can be predicted from the deterioration degree.

On the other hand, since the Cy dummy pixel 811Cy has an emission state where the G light and the B light emit light at the same time, this state can be said to be the same as the state where the B light is applied to the G dummy pixel 811G. Accordingly, the deterioration degree calculated from the detection result of the optical sensor 812Cy is a deterioration degree obtained by adding the deterioration degree of the organic EL element emitting the G light to the deterioration degree due to the application of the B light to the transistor in the pixel.

Therefore, the deterioration degree calculating unit 82 calculates a difference between the deterioration degree calculated from the detection result of the optical sensor 812G and the deterioration degree calculated from the detection result of the optical sensor 812Cy. This difference is the characteristic deterioration degree due to the application of the B light to the transistor in the pixel. Accordingly, the deterioration degree calculating unit 82 can calculate the deterioration degree of the organic EL element from the detection result of the optical sensor 812G and can calculate the characteristic deterioration degree due to the application of the B light to the transistor in the pixel using the difference.

The correction unit 83 is formed by a FPGA (Field Programmable Gate Array) or the like. The correction unit 83 calculates an image burn-in correction degree on the basis of the deterioration degree of the organic EL element and the deterioration degree due to the application of the B light to the transistor in the pixel, which are calculated by the deterioration degree calculating unit 82. The correction unit 83 corrects the emission brightness of the corresponding effective pixel 20 by controlling the level of the image signal SIG for driving the effective pixel 20 in the area in which the image burn-in phenomenon occurs on the basis of the calculated image burn-in correction degree.

By this correction of brightness, the image burn-in phenomenon due to the characteristic deterioration of the organic EL element as the self-emission element and the image burn-in phenomenon due to the current deterioration based on the application of the B light can be corrected in terms of the signal processing. Here, as described above, the image burn-in phenomenon due to the current deterioration based on the application of the B light is an image burn-in phenomenon caused by deteriorating the current flowing in the organic EL element 21 when the Vth characteristic of the writing transistor 23 out of the transistors in the pixel is shifted due to the application of the B light.

The image signal corrected by the correction unit 83 is supplied to a driver 90 displaying an image by driving the effective pixels 20 of the display panel 70. A module such as the driver 90 is disposed on the back side of the display panel 70. The driver 90 supplies the signal voltage Vsig of the image signal to the signal output circuit (selector) 60 shown in FIG. 2.

In this way, the image burn-in correcting circuit 80 according to this embodiment correcting the image burn-in phenomenon in terms of the signal processing has a process path of the dummy pixels 811A and 811B→the optical sensors 812A and 812B→the deterioration degree calculating unit 82→the correction unit 83→and the driver 90. The circuit for realizing the image burn-in correcting function is not limited to the above-mentioned image burn-in correcting circuit 80, but may have any configuration as long as it can correct the image burn-in phenomenon in terms of the signal processing.

3-2. Operational Advantages of Embodiments

As described above, by providing the first dummy pixels including light-emitting elements emitting first color light and the second dummy pixels including light-emitting elements emitting the first color light and light-emitting elements emitting second color light other than the first color light, the following operational advantages can be obtained. First, the brightness deterioration degree of the organic EL element can be calculated on the basis of the brightness detection result from the first dummy pixels.

In addition, by calculating the difference between the deterioration degree calculated on the basis of the brightness detection result from the first dummy pixels and the deterioration degree calculated on the basis of the brightness detection result from the second dummy pixels, it is possible to calculate the deterioration degree in transistor characteristic in the pixels due to the application of the B light. As described above, since the transistor characteristic in the pixel, particularly, the Vth characteristic of the writing transistors 23 is shifted, the current flowing in the organic EL element 21 is deteriorated. That is, the difference is the deterioration degree of the current flowing in the organic EL element 21 due to the application of the B light.

On the basis of the calculated deterioration degrees, that is, the brightness deterioration degree of the organic EL element and the deterioration degree of the current flowing in the organic EL element 21 due to the application of the B light, the characteristic deterioration of the effective pixels 20 in the area in which the image burn-in phenomenon occurs is predicted to determine the image burn-in correction degree. Then, by correcting the image burn-in on the basis of the determined image burn-in correction degree, it is possible to perform the image burn-in correcting process in consideration of the image burn-in phenomenon due to the current deterioration based on the application of the different color light from the self-emission elements other than the corresponding self-emission element in addition to the image burn-in phenomenon due to the characteristic deterioration of the self-emission element.

4. MODIFIED EXAMPLE

The organic EL display device employing the organic EL elements as the electro-optical elements (light-emitting elements) of the pixels 20 has been stated in the above-mentioned embodiments, but the invention is not limited to the embodiments. That is, the invention may be applied to all self-emission type display devices employing self-emission elements such as inorganic EL elements, LED elements, and semiconductor laser elements as the electro-optical elements of the pixels 20.

5. APPLICATIONS

The above-mentioned display device can be applied as display devices of electronic apparatuses in all the fields in which image signals input to the electronic apparatuses or image signals generated from the electronic apparatuses are displayed as an image or a video. The display device can be applied as a display device of various electronic apparatuses shown in FIGS. 17 to 21G, such as a digital camera, a notebook personal computer, a mobile terminal such as a mobile phone, and a video camera.

In this way, by using the display device according to the embodiments of the invention as a display device of all the electronic apparatuses, it is possible to display an image with high quality in various electronic apparatuses. That is, as can be seen from the above-mentioned embodiments, since the display device according to the embodiments of the invention can correct the image burn-in in consideration of the current deterioration due to the application of different color light in addition to the characteristic deterioration of the self-emission elements, it is possible to obtain a display image with high quality.

The display device according to the embodiments of the invention includes a sealed module type. For example, a display module formed by attaching a counter part such as a transparent glass plate to the pixel array unit 30 can be used. The transparent count part may be provided with a color filter, a protective film, and the above-mentioned light-blocking film. The display module may be provided with a circuit unit or an FPC (Flexible Printed Circuit) for externally inputting and outputting signals to and from the pixel array unit.

Specific examples of the electronic apparatus to which the invention is applied will be described below.

Figure 17:
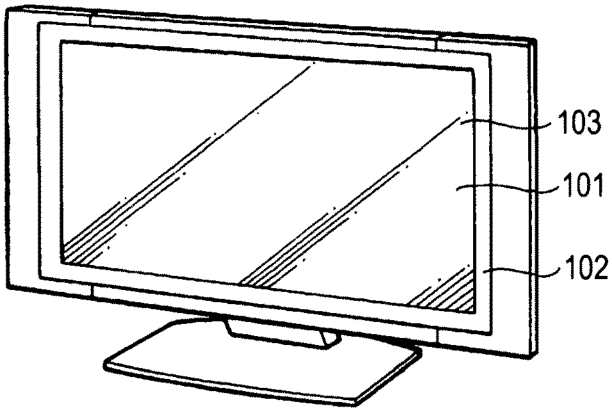
FIG. 17 is a perspective view illustrating an appearance of a television set according to an embodiment of the invention.

FIG. 17 is a perspective view illustrating the appearance of a television set to which the invention is applied. The television set according to this application includes an image display screen 101 including a front panel 102 or a filter glass 103 and employs the display device according to the embodiments of the invention as the image display screen 101.

Figure 18A:
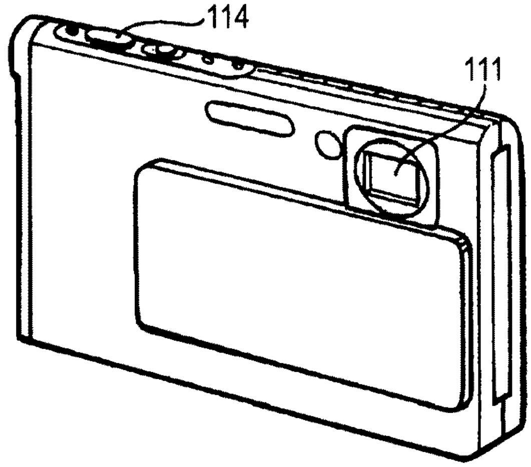
FIGS. 18A and 18B are perspective views illustrating an appearance of a digital camera according to an embodiment of the invention, where
Figure 18B:
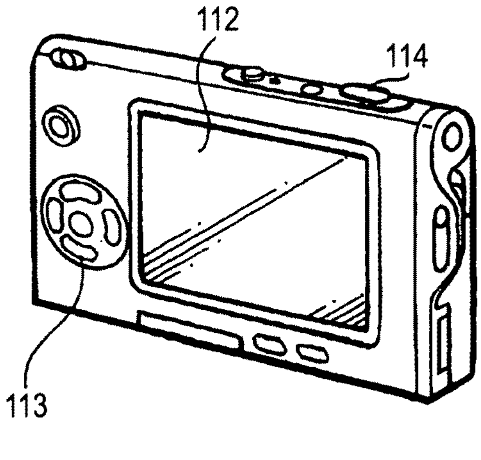

FIGS. 18A and 18B are perspective views illustrating the appearance of a digital camera to which the invention is applied, where FIG. 18A is a perspective view as viewed from the front side and FIG. 18B is a perspective view as viewed from the back side. The digital camera according to this application includes a light-emitting unit 111 for a flash, a display unit 112, a menu switch 113, and a shutter button 114 and employs the display device according to the embodiments of the invention as the display unit 112.

Figure 19:
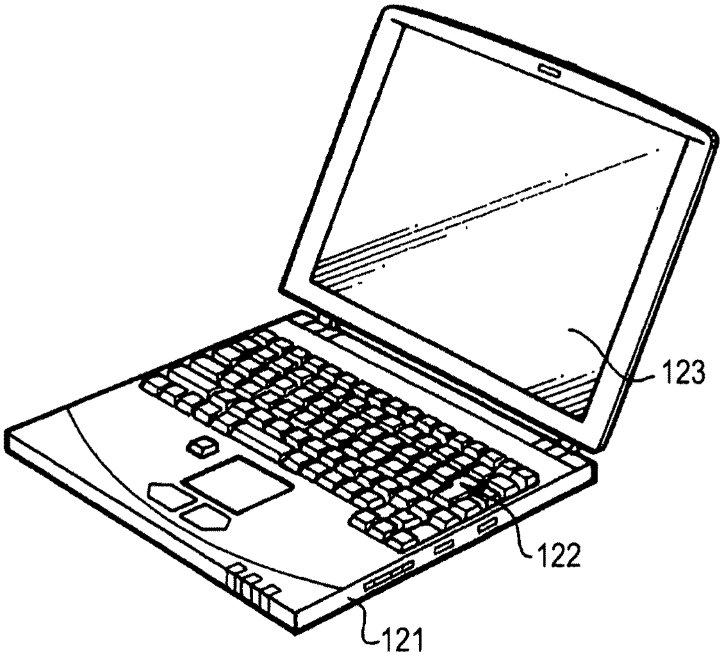
FIG. 19 is a perspective view illustrating an appearance of a notebook personal computer according to an embodiment of the invention.

FIG. 19 is a perspective view illustrating the appearance of a notebook personal computer to which the invention is applied. The notebook personal computer according to this application includes a main body 121, a keyboard 122 to be operated at the time of inputting characters or the like, and a display unit 123 displaying an image and employs the display device according to the embodiments of the invention as the display unit 123.

Figure 20:
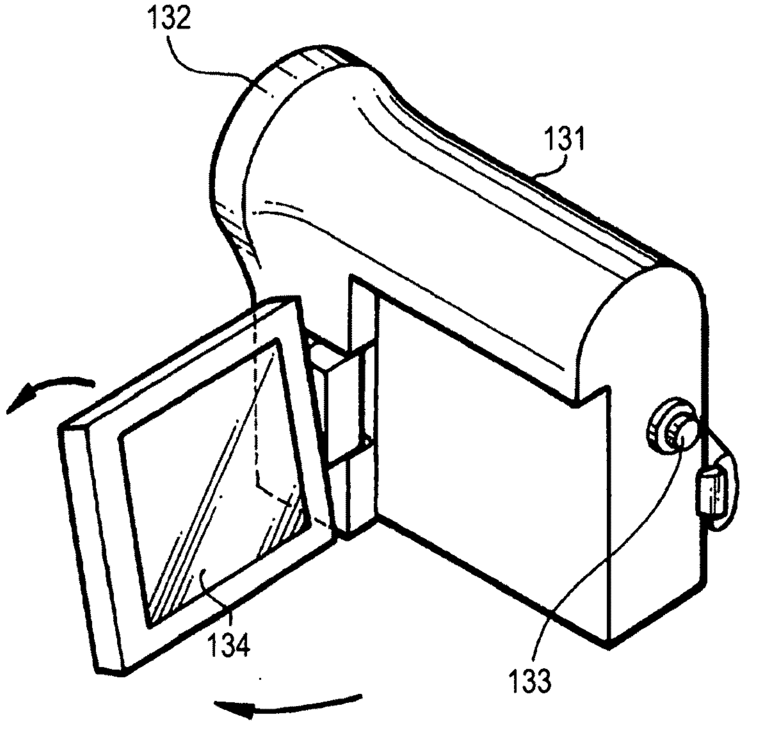
FIG. 20 is a perspective view illustrating an appearance of a video camera according to an embodiment of the invention.

FIG. 20 is a perspective view illustrating the appearance of a video camera to which the invention is applied. The video camera according to this application includes a main body 131, a subject photographing lens 132 disposed on the surface facing the front, a start/stop switch for photographing 133, and a display unit 134 and employs the display device according to the embodiments of the invention as the display unit 134.

Figures 21A, 21B, 21C, 21D, 21E, 21F, 21G:
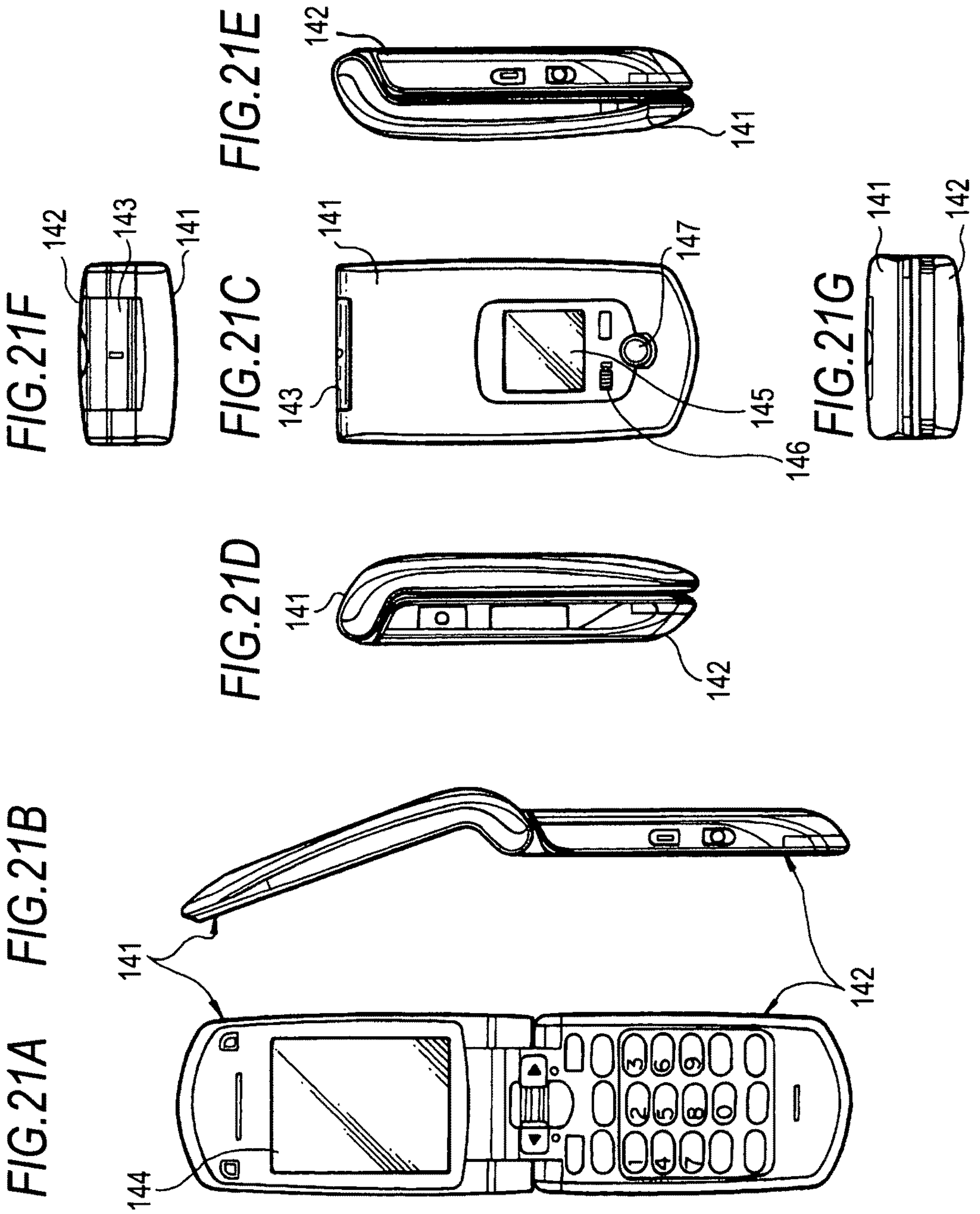
FIGS. 21A to 21G are diagrams illustrating an appearance of a mobile phone according to an embodiment of the invention, where

FIGS. 21A to 21G are diagrams illustrating an appearance of a mobile phone according to an embodiment of the invention, where FIG. 21A is a front view illustrating an opened state, FIG. 21B is a side view, FIG. 21C is a front view illustrating a closed state, FIG. 21D is a left side view, FIG. 21E is a right side view, FIG. 21F is a top view, and FIG. 21G is a bottom view. The mobile phone according to this application includes an upper chassis 141, a lower chassis 142, a connection unit (a hinge section) 143, a display 144, a sub display 145, a picture light 146, and a camera 147. The mobile phone according to this application employs the display device according to the embodiments of the invention as the display 144 or the sub display 145.

The present application contains subject matter related to that disclosed in Japanese Priority Patent Application JP 2009-230235 filed in the Japan Patent Office on Oct. 2, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:

first dummy pixels including a first self-emission element that emits a first color light corresponding to emission colors of pixels in a display area;

second dummy pixels including a second self-emission element that emits the first color light and a third self-emission element that emits a second color light and causing the second and third self-emission elements to emit light at the same time;

a deterioration degree calculating unit calculating a deterioration degree in brightness of the first self-emission element emitting the first color light on the basis of a brightness detection result of the first dummy pixels and calculating a deterioration degree in current flowing in the first self-emission element emitting the first color light on the basis of brightness detection results of the first and second dummy pixels when the second dummy pixels emit the first and second color lights at the same time; and a correction unit correcting the brightness of effective pixels contributing to an image display on the basis of the deterioration degree in brightness and the deterioration degree in current calculated by the deterioration degree calculating unit.

2. The display device according to claim 1, wherein the deterioration degree calculating unit calculates a difference between the deterioration degree calculated on the basis of the brightness detection result of the first dummy pixels and the deterioration degree calculated on the basis of the brightness detection result of the second dummy pixels and uses the difference as the deterioration degree in current.

3. The display device according to claim 1, wherein the first color light includes green light and red light and the second color light is blue light.

4. The display device according to claim 1, wherein the first and second dummy pixels include a plurality of dummy pixels emitting light with different emission brightness values.

5. The display device according to claim 1, wherein the effective pixels have a function of a mobility correcting process of applying a negative feedback to a gate-source potential difference of a driving transistor driving the first self-emission element by the use of a correction degree corresponding to the current flowing in the driving transistor.

6. The display device according to claim 5, wherein the effective pixels include a writing transistor writing an image signal and determine a correction period of the mobility correcting process on the basis of a turn-on period of the writing transistor.

7. The display device according to claim 6, wherein the deterioration degree calculating unit calculates a deterioration degree in characteristic of the writing transistor from the difference between the deterioration degree calculated on the basis of the brightness detection result of the first dummy pixels and the deterioration degree calculated on the basis of the brightness detection result of the second dummy pixels.

8. A driving method of a display device including first dummy pixels including a first self-emission element that emits a first color light corresponding to emission colors of pixels in a display area and second dummy pixels including a second self-emission element that emits the first color light and a third self-emission element that emits a second color light and causing the second and third self-emission elements to emit light at the same time, the driving method comprising:

calculating a deterioration degree in brightness of the first self-emission element emitting the first color light on the basis of a brightness detection result of the first dummy pixels and calculating a deterioration degree in current flowing in the first self-emission element emitting the first color light on the basis of brightness detection results of the first and second dummy pixels when the second dummy pixels emit the first and second color lights at the same time; and correcting the brightness of effective pixels contributing to an image display on the basis of the calculated deterioration degree in brightness and the calculated deterioration degree in current calculated in the step of calculating a deterioration degree.

9. The driving method of the display device according to claim 8, further comprising:

calculating a difference between the deterioration degree calculated on the basis of the brightness detection result of the first dummy pixels and the deterioration degree calculated on the basis of the brightness detection result of the second dummy pixels; and using the difference as the deterioration degree in current.

10. The driving method of the display device according to claim 8, wherein the first color light includes green light and red light and the second color light is blue light.

11. The driving method of the display device according to claim 8, wherein the first and second dummy pixels include a plurality of dummy pixels emitting light with different emission brightness values.

12. The driving method of the display device according to claim 8, further comprising applying a negative feedback to a gate-source potential difference of a driving transistor driving the first self-emission element by the use of a correction degree corresponding to the current flowing in the driving transistor.

13. The driving method of the display device according to claim 12, further comprising:

writing, by a writing transistor, an image signal; and determining a correction period of the mobility correcting process on the basis of a turn-on period of the writing transistor.

14. The driving method of the display device according to claim 13, further comprising:

calculating a deterioration degree in characteristic of the writing transistor from the difference between the deterioration degree calculated on the basis of the brightness detection result of the first dummy pixels and the deterioration degree calculated on the basis of the brightness detection result of the second dummy pixels.

15. An electronic apparatus having a display device comprising:

first dummy pixels including a first self-emission element emitting first color light corresponding to emission colors of pixels in a display area;

second dummy pixels including a second self-emission element that emits the first color light and a third self-emission element that emits a second color light and causing the second and third self-emission elements to emit light at the same time;

a deterioration degree calculating unit calculating a deterioration degree in brightness of the first self-emission element emitting the first color light on the basis of a brightness detection result of the first dummy pixels and calculating a deterioration degree in current flowing in the first self-emission element emitting the first color light on the basis of brightness detection results of the first and second dummy pixels when the second dummy pixels emit the first and second color lights at the same time; and a correction unit correcting the brightness of effective pixels contributing to an image display on the basis of the deterioration degree in bright and the deterioration degree in current calculated by deterioration degree calculating unit.

16. The electronic apparatus according to claim 15, wherein the deterioration degree calculating unit calculates a difference between the deterioration degree calculated on the basis of the brightness detection result of the first dummy pixels and the deterioration degree calculated on the basis of the brightness detection result of the second dummy pixels and uses the difference as the deterioration degree in current.

17. The electronic apparatus according to claim 15, wherein the first color light includes green light and red light and the second color light is blue light.

* * * * *